United States Patent
Nandakumar et al.

(10) Patent No.: US 10,497,695 B2
(45) Date of Patent: Dec. 3, 2019

(54) COMPENSATED WELL ESD DIODES WITH REDUCED CAPACITANCE

(71) Applicant: Texas Instruments Incorporated, Dallas, TX (US)

(72) Inventors: Mahalingam Nandakumar, Richardson, TX (US); Sunitha Venkataraman, Dallas, TX (US); David L. Catlett, Jr., Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/414,164

(22) Filed: Jan. 24, 2017

(65) Prior Publication Data

US 2017/0133361 A1 May 11, 2017

Related U.S. Application Data

(62) Division of application No. 14/497,601, filed on Sep. 26, 2014, now Pat. No. 9,589,959, which is a division of application No. 13/710,103, filed on Dec. 10, 2012, now Pat. No. 8,941,181.

(60) Provisional application No. 61/568,421, filed on Dec. 8, 2011.

(51) Int. Cl.
*H01L 27/092* (2006.01)
*H01L 27/02* (2006.01)
*H01L 27/06* (2006.01)
*H01L 27/08* (2006.01)
*H01L 29/06* (2006.01)

(52) U.S. Cl.
CPC ...... *H01L 27/0255* (2013.01); *H01L 27/0629* (2013.01); *H01L 27/0811* (2013.01); *H01L 27/0814* (2013.01); *H01L 27/0928* (2013.01); *H01L 29/0649* (2013.01)

(58) Field of Classification Search
CPC ....... H01L 27/092; H01L 29/06; H01L 27/02; H01L 27/0255; H01L 23/60; H01L 27/0266; H01L 27/0259; H01L 27/0248; H01L 29/861; H01L 23/62; H01L 29/0649; H01L 27/0814; H01L 27/0928; H01L 27/0629
See application file for complete search history.

(56) References Cited

U.S. PATENT DOCUMENTS

| | | | |
|---|---|---|---|
| 2008/0023767 A1* | 1/2008 | Voldman | H01L 27/0255 257/355 |
| 2011/0101465 A1 | 5/2011 | Zitouni et al. | |
| 2012/0242400 A1 | 9/2012 | Shaeffer et al. | |

* cited by examiner

*Primary Examiner* — Cuong B Nguyen
(74) *Attorney, Agent, or Firm* — Jacqueline J. Garner; Charles A. Brill; Frank D. Cimino

(57) ABSTRACT

An integrated circuit with a shallow trench isolated, low capacitance, ESD protection diode. An integrated circuit with a gate space isolated, low capacitance, ESD protection diode. An integrated circuit with a gate space isolated, low capacitance, ESD protection diode in parallel with a shallow trench isolated, low capacitance, ESD protection diode.

15 Claims, 19 Drawing Sheets

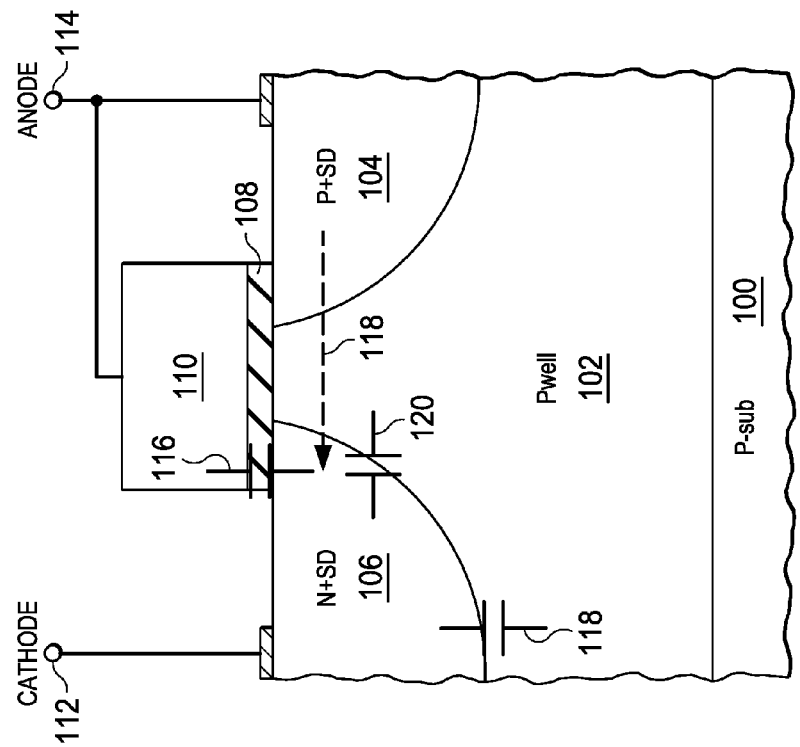
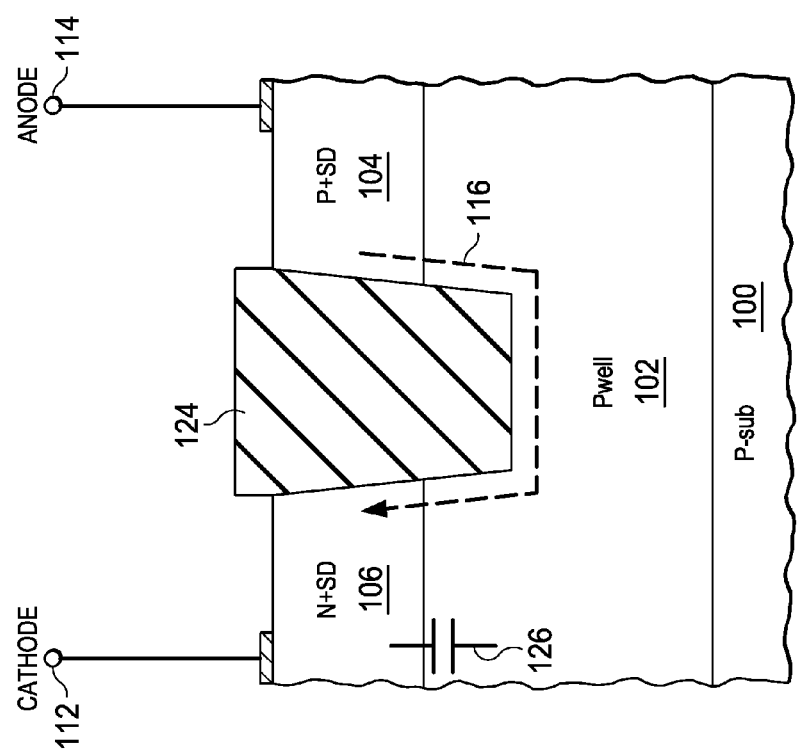
FIG. 1 (PRIOR ART)
FIG. 2 (PRIOR ART)

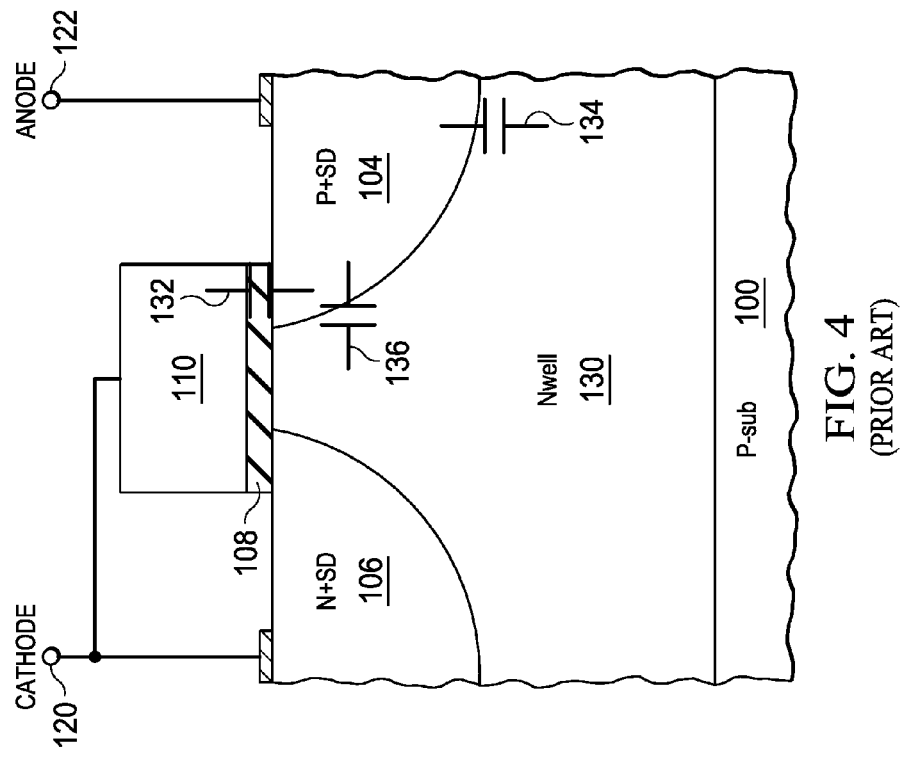
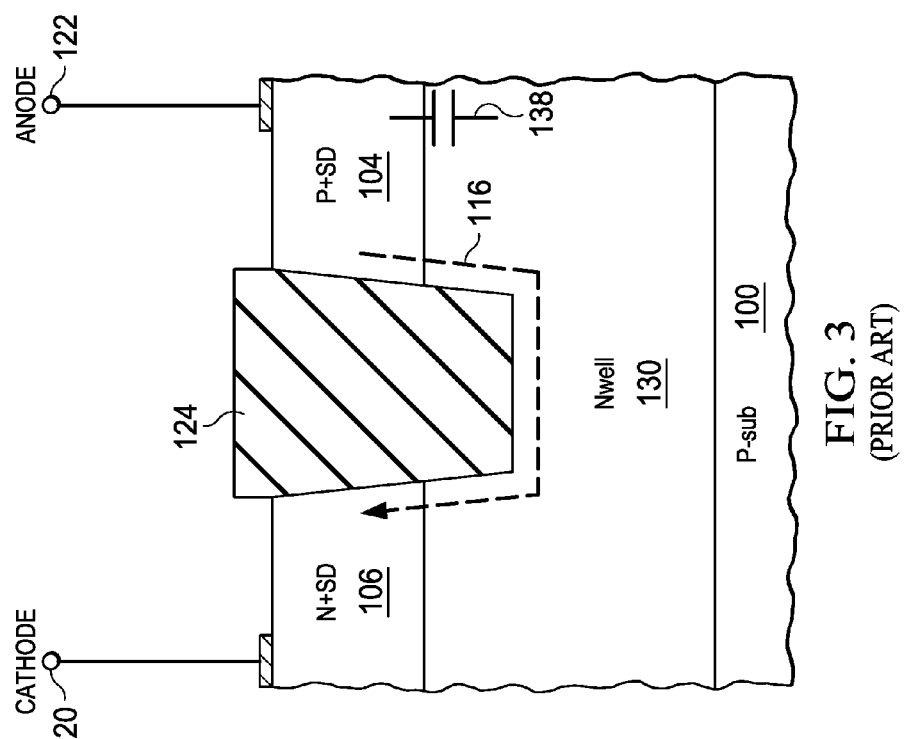

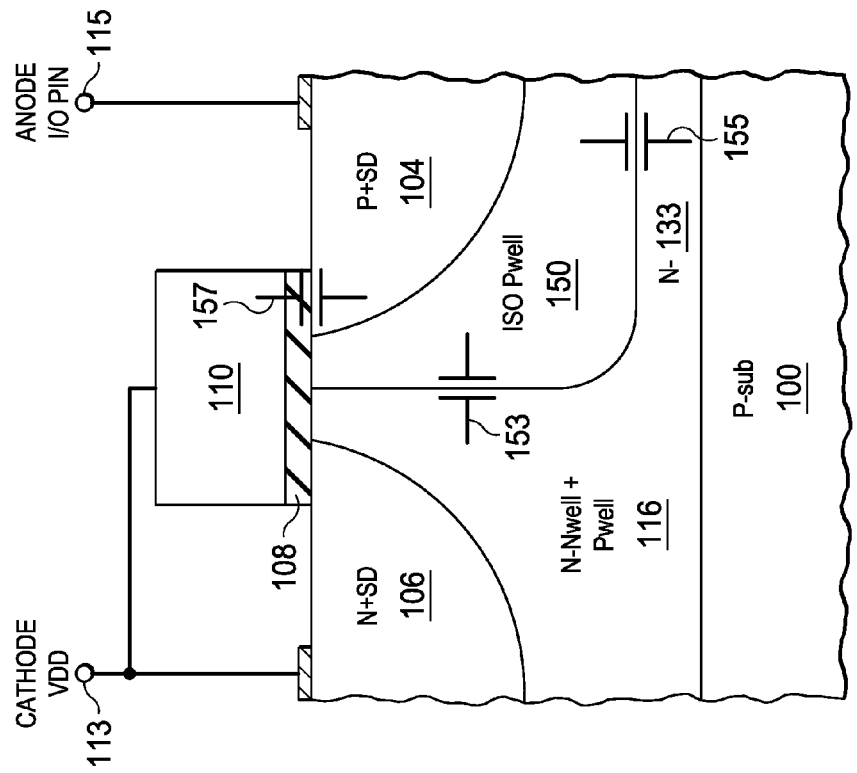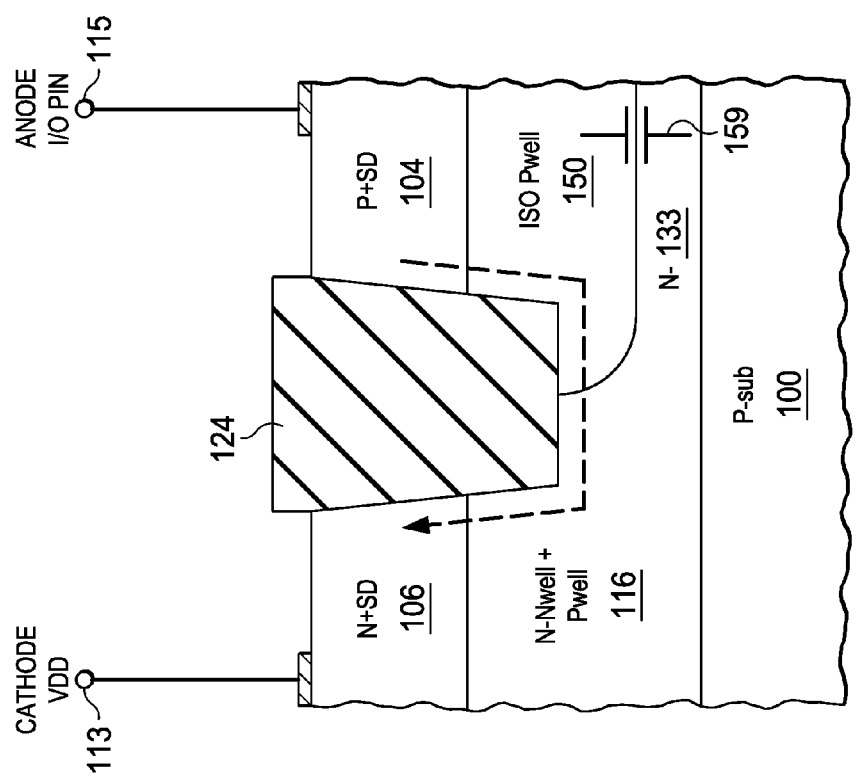

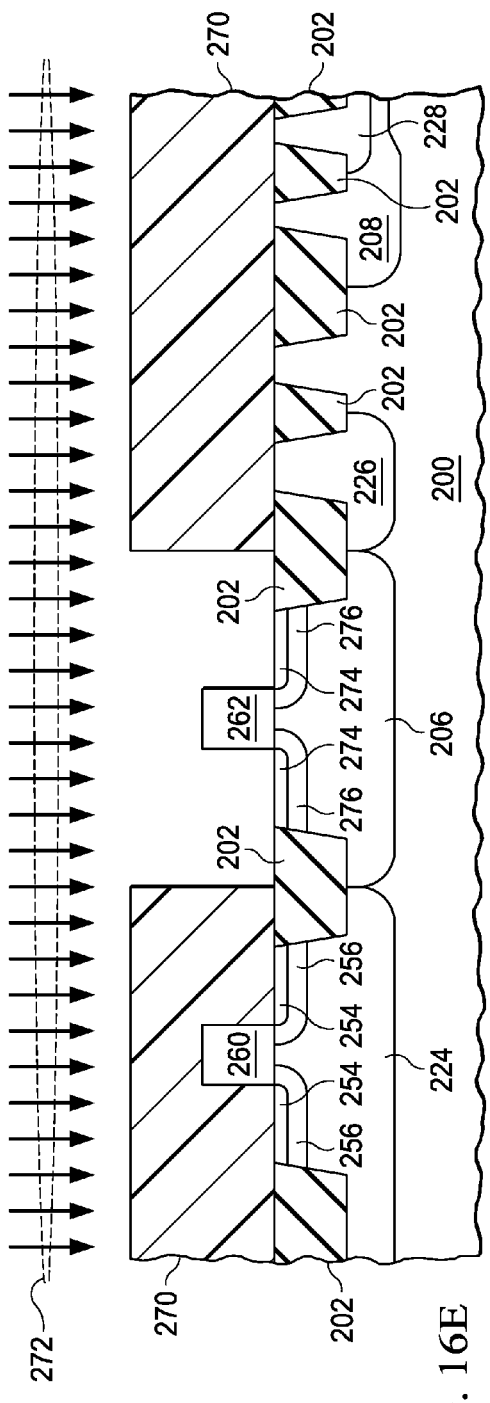
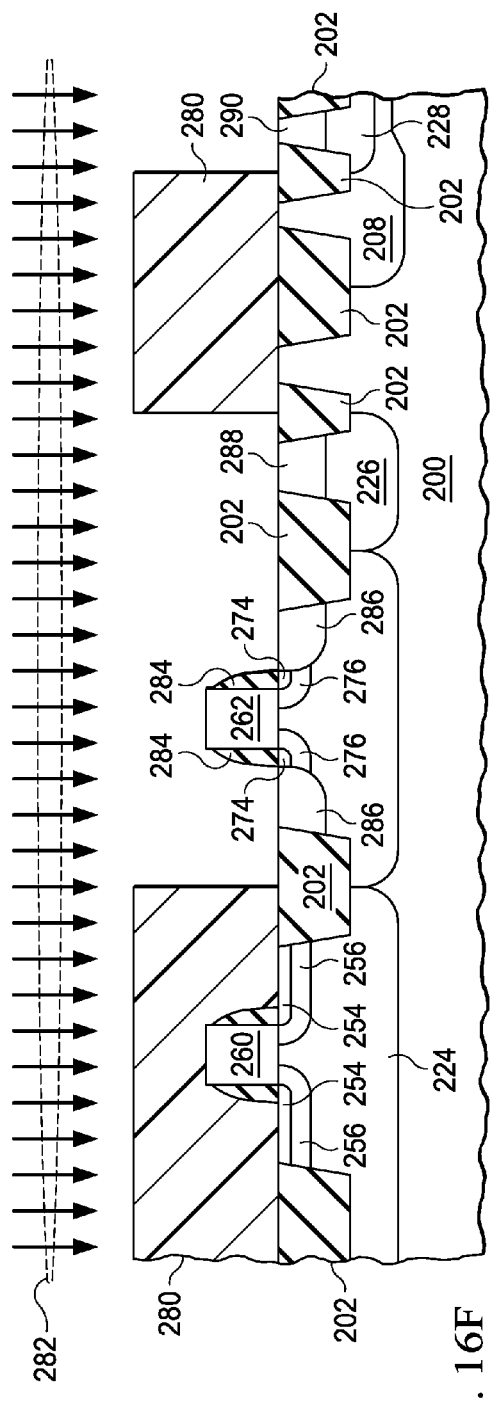
FIG. 16E
FIG. 16F

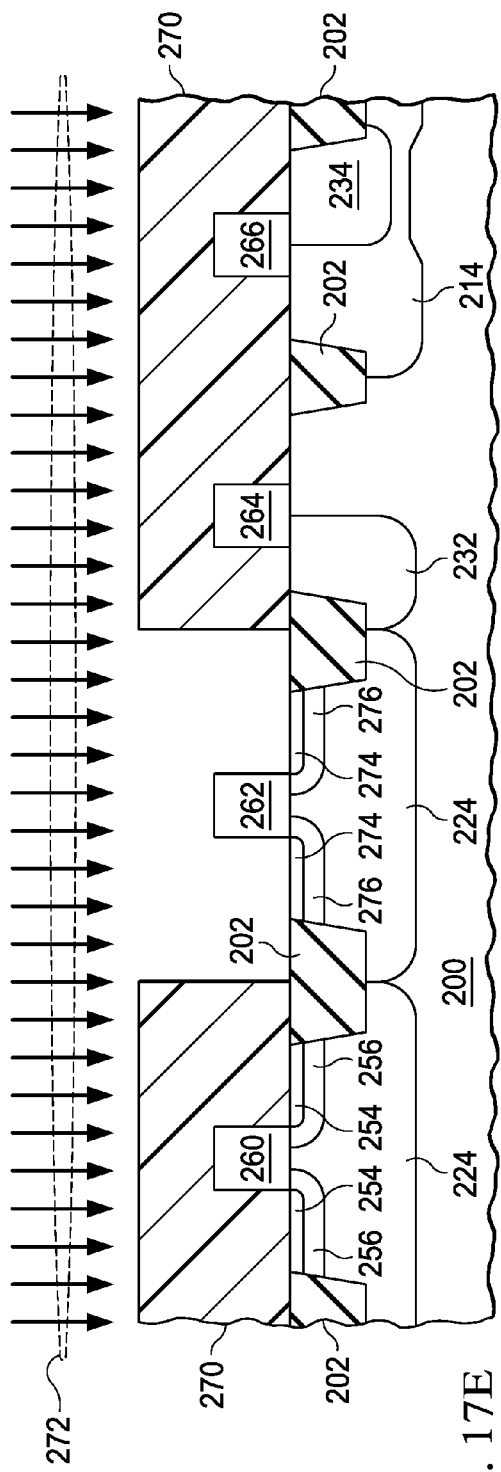
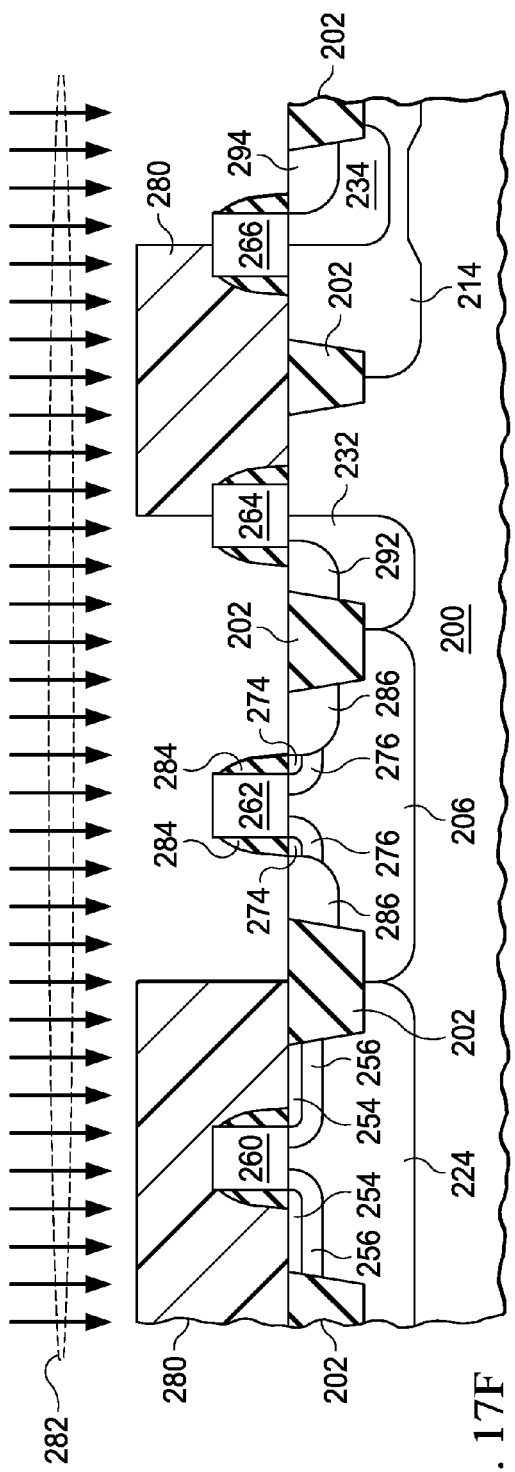
FIG. 17E
FIG. 17F

COMPENSATED WELL ESD DIODES WITH REDUCED CAPACITANCE

CROSS REFERENCE TO RELATED APPLICATIONS

This application is a divisional of U.S. Nonprovisional patent application Ser. No. 14/497,601, filed Sep. 26, 2014, which is a divisional of U.S. Nonprovisional patent application Ser. No. 13/710,103, filed Dec. 10, 2012 (now U.S. Pat. No. 8,941,181), and claims the benefit of U.S. Provisional Application Ser. No. 61/568,421, filed Dec. 8, 2011, the contents of all of which are herein incorporated by reference in its entirety.

FIELD OF THE INVENTION

This invention relates to the field of integrated circuits. More particularly, this invention relates to ESD protection diodes in integrated circuits.

BACKGROUND

Electrostatic discharge (ESD) is a continuing problem in the design, manufacture, and utilization of integrated circuits (ICs). A major source of ESD exposure to ICs is from the human body (described by the "Human Body Model", HBM). In this situation, a packaged IC acquires a charge when it is touched by a human who is electrostatically charged (e.g. from walking across a carpet). A charge of about 0.4 uC may be induced on a body capacitance of 100 pF, for example, leading to an electrostatic potential of 4 kV or more and discharge peak currents of several amperes to the IC for longer than 100 ns. A second source of ESD exposure is from charged metallic objects (described by the "Machine Model", MM), which is characterized by a greater capacitance, lower internal resistance and transients that have significantly higher peak current levels than a HBM ESD source. A third source of ESD exposure is due to the discharge of stored charge on the integrated circuit itself (described by the "Charged Device Model", CDM), to ground with rise times of less than 500 ps. The current flow during CDM is in the opposite direction of the HBM and MM ESD sources. For all three sources of ESD exposure, both positive and negative polarity discharges may occur.

A typical shallow trench isolation (STI) ESD protection diode which shorts the I/O pin to ground during an ESD event is shown in FIG. 1. The anode 114 which may be connected to Vss or ground is connected by P+ contact diffusion 104 to a pwell 102. The cathode 112 which is typically connected to an input/output (I/O) pin is connected to an N+ diffusion 106. The N+ diffusion 106 forms the STI ESD protection diode to the pwell 102. The pwell is typically formed on a more lightly doped p-type substrate 100.

During an ESD strike, the ESD diode may become forward biased shorting the input pin to Vss and shunting the ESD current to ground thus protecting the integrated circuit from damage. The time it takes for the ESD diode to turn on is proportional to the length of the current path 116. Because of the length of the current path 16 under the STI 124 during a fast rise time ESD event, a significant voltage overshoot 150 may occur as shown in FIG. 5.

To prevent ESD voltage overshoot a gate spaced ESD diode (GS ESD diode) such as is shown in FIG. 2 may be used. Because the current path 118 in the GS ESD P/N diode is shorter than the current path 116 of the STI ESD P/N diode, the turn on is significantly faster. The faster turn on time of the GS ESD diode avoids voltage overshoot as shown by the graph 152 in FIG. 5.

A typical shallow trench isolation (STI) ESD N/P protection diode which shorts the I/O pin to Vdd is shown in FIG. 3. The anode 122 which typically is connected to an I/O pin is connected to a diode formed between P+ diffusion 104 and nwell 130. The cathode 120 which typically is connected to Vdd is connected to the N+ diffusion 106 nwell 130 contact. The nwell 130 is typically formed in the p-type substrate 100.

A gate spaced (GS) ESD protection N/P diode which shorts the I/O pin to Vdd is shown in FIG. 4. In the GS ESD N/P diode a gate 110 and gate dielectric 108 electrically isolated the anode 122 from the cathode 132. The anode 122 is connected to P+ diffusion in the nwell. The cathode 120 is shorted to the gate 110 and is connected to the N+ 106 nwell 130 contact. The ESD protection diode is formed between the P+ diffusion 104 and the nwell 130.

A problem with the STI ESD P/N diode that is even more pronounced with the GS ESD P/N diode is capacitance. As shown in Table 1 the capacitance of a gate spaced ESD P/N diode (bottom wall capacitance 118, plus sidewall capacitance 120 plus gate overlap capacitance 116) may be more than twice the capacitance of a STI spaced ESD diode (bottom wall capacitance 126 in FIG. 1). The additional capacitance that the STI spaced or gate spaced ESD protection diode adds to the I/O pin may reduce the performance of the IC and may limit the maximum frequency at which the IC may be operated.

TABLE 1

| TYPE | Measured Capacitance (fF) | Voltage overshoot (V) |
|---|---|---|
| STI Diode | 85 | 9 |
| Gate spaced diode | 191 | 0 |

SUMMARY

An integrated circuit with a shallow trench isolated, low capacitance, ESD protection diode. An integrated circuit with a gate space isolated, low capacitance, ESD protection diode. An integrated circuit with a gate space isolated, low capacitance, ESD protection diode wired in parallel with a shallow trench isolated, low capacitance, ESD protection diode.

BRIEF DESCRIPTION OF THE DRAWINGS

FIG. 1 (Prior art) is a cross-section of a shallow trench isolation spaced ESD protection P/N diode.

FIG. 2 (Prior art) is a cross-section of a gate spaced ESD protection P/N diode.

FIG. 3 (Prior art) is a cross-section of a shallow trench spaced ESD protection N/P diode.

FIG. 4 (Prior art) is a cross-section of a gate spaced ESD protection N/P diode.

FIG. 12 is a cross-section of an embodiment of a shallow trench spaced, ESD protection, N/P diode formed according to principles of the invention FIG. 13 is a cross-section of an embodiment of a gate spaced, ESD protection, N/P diode formed according to principles of the invention

FIGS. 16A-16H are illustrations of steps in the fabrication of integrated circuits with low capacitance STI ESD diodes formed according to principles of the invention.

FIGS. 17A-17H are illustrations of steps in the fabrication of integrated circuits with low capacitance GS ESD diodes formed according to principles of the invention.

DETAILED DESCRIPTION OF EXAMPLE EMBODIMENTS

Figure 6:
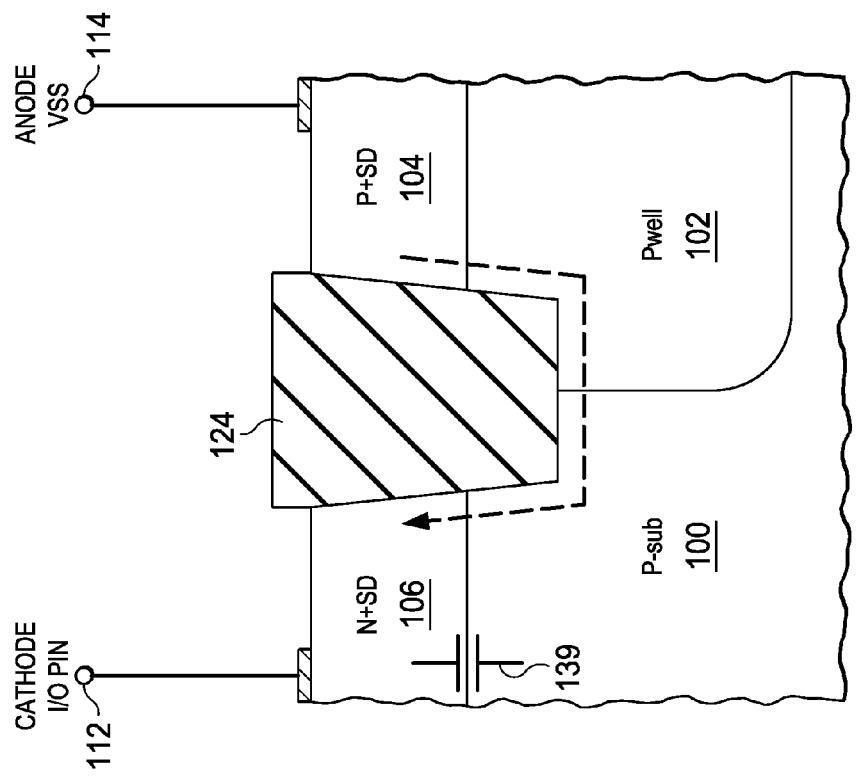
FIG. 6 is a cross-section of an embodiment of a low capacitance, shallow trench isolation spaced, ESD protection P/N diode formed according to principles of the invention.

An embodiment of an STI spaced ESD protection P/N diode (STI ESD P/N diode) with reduced capacitance is illustrated in FIG. 6. The cathode 112 which is connected to the N+ diffusion 106 of the STI ESD P/N diode is connected to an input/output (I/O) pin. The anode 114 which is connected to the P+ diffusion of the STI ESD P/N diode is connected to Vss or ground. During an ESD event on the I/O pin a pulse of ESD current causes the STI ESD P/N diode to become forward biased shunting the ESD current to Vss or ground.

The STI ESD P/N diode is formed in a p-type substrate 100. Shallow trench isolation 124 separates the N+ diffusion 106 from contacting the P+ diffusion 104. Unlike the conventional STI ESD P/N diode in FIG. 1, the pwell is removed from under the N+ diffusion 106. Since the p-type substrate 100 is more lightly doped than the pwell 102, the depletion region formed when the N+ diffusion 106 is reversed biased is significantly larger than the depletion region formed between the N+ diffusion and the more heavily doped pwell in the conventional STI ESD P/N diode in FIG. 1. Since diode capacitance is inversely proportional to the width of the depletion region formed when the diode is reverse biased, the diode capacitance is significantly reduced. The lower capacitance of the STI ESD P/N diode reduces degradation of circuit performance and enables the integrated circuit to operate at higher frequencies. In an example embodiment of an STI ESD P/N diode, the p-type substrate 100 doping concentration is about $1.4 \times 10^{15}/cm^3$, the pwell 102 doping concentration is about $8 \times 10^{17}/cm^3$, and the N+ diffusion 106 doping concentration is about $3 \times 10^{20}/cm^3$. A depletion region formed between the N+ diffusion 106 and the p-type substrate 100 is about 20 times larger than a depletion region formed between the N+ diffusion 106 and the pwell 102. The STI ESD P/N diode in the example embodiment reduces the STI ESD P/N diode capacitance by about 20 times.

Figure 8:
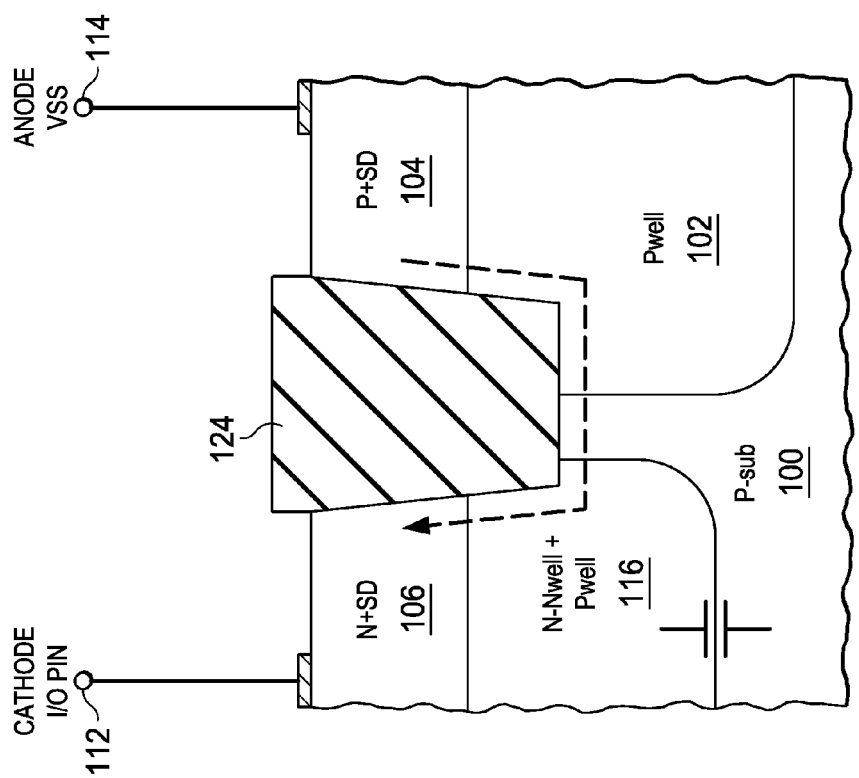
FIG. 8 is a cross-section of an embodiment of a shallow trench spaced, ESD protection, N/P diode formed according to principles of the invention

Another embodiment of an STI ESD P/N diode with an additional reduction in capacitance is illustrated in FIG. 8. An N– counter doped nwell 116 is formed under the N+ diffusion 106 by implanting both nwell dopant and pwell dopant into the same region. By appropriate selection of the nwell and pwell doping concentrations, a lightly doped isolated pwell may be formed in an nwell when both the nwell and pwell dopants are implanted into the same substrate region. The nwell under the lightly doped isolated pwell is partially counter doped and is lightly doped (N–). The NSD dopant counter dopes the lightly doped isolated pwell changing it to N+ 106 at the surface and to a counter doped nwell N– diffusion 116 under the surface. The STI ESD P/N diode is formed in this embodiment example between the counter doped nwell N– diffusion 116 and the lightly doped p-type substrate 100. The depletion region formed is significantly larger than the depletion region formed between the heavily doped N+ diffusion 106 and the pwell 102 (FIG. 1). In an example embodiment of an STI ESD P/N diode, the p-type substrate 100 doping concentration is about $1.4 \times 10^{15}/cm^3$, the pwell 102 doping concentration is about $8 \times 10^{17}/cm^3$, and the counter doped nwell diffusion 116 doping concentration is about $3 \times 10^{17}/cm^3$. A depletion region formed between the counter doped nwell diffusion 116 and the p-type substrate 100 is about 20 times larger than a depletion region formed between the N+ diffusion 106 and the pwell 102 (FIG. 1). The STI ESD P/N diode in the example embodiment reduces the STI ESD P/N diode capacitance by about 10 times.

Figure 5:
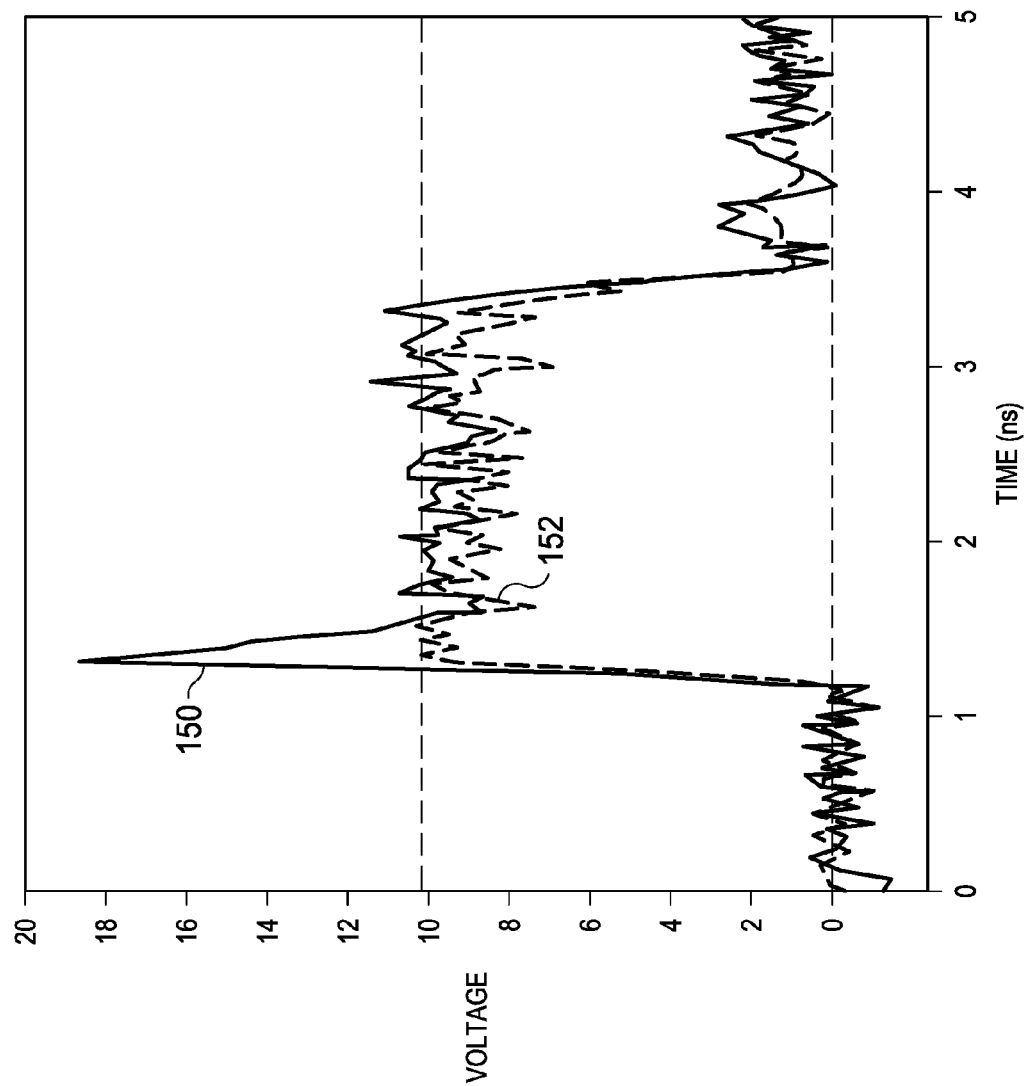
FIG. 5 is a graph comparing the response of a shallow trench isolation spaced ESD protection diode to the response of a gate spaced ESD protection diode.
Figure 7:
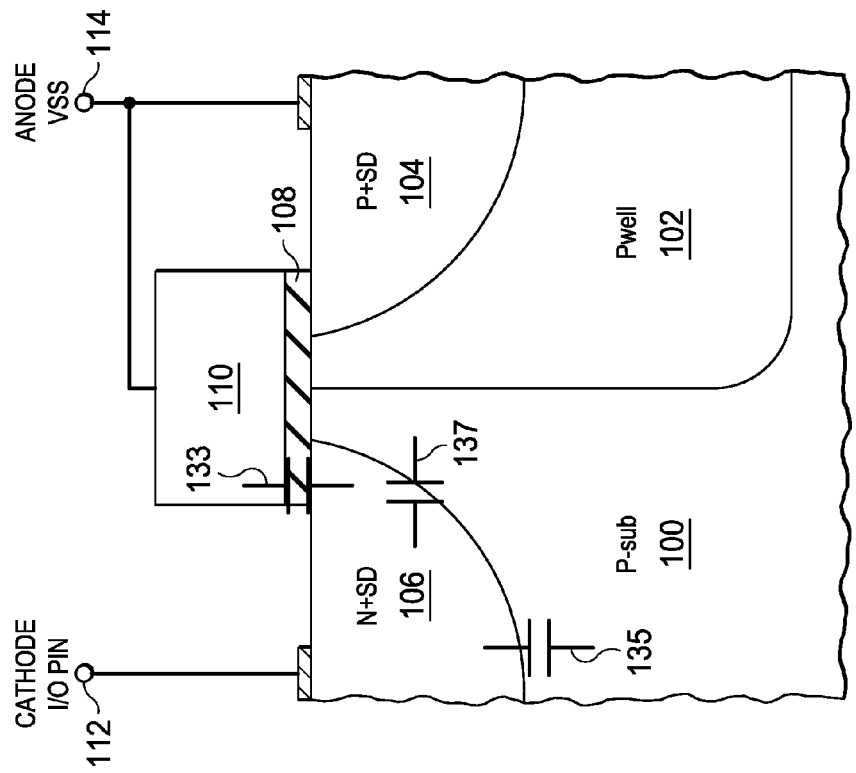
FIG. 7 is a cross-section of an embodiment of a gate spaced, ESD protection P/N diode formed according to principles of the invention

An embodiment of a gate spaced ESD protection P/N diode (GS ESD P/N diode) with reduced capacitance is illustrated in FIG. 7. The cathode 112 which is connected to the N+ diffusion 106 of the GS ESD P/N diode is connected to an input/output (I/O) pin. The anode 114 which is shorted to the ESD diode gate 110 is connected to the P+ diffusion of the GS ESD P/N diode and is also connected to Vss or ground. During an ESD event on the I/O pin a pulse of ESD current causes the GS ESD P/N diode to become forward biased shunting the ESD current to Vss or ground thus protecting the IC from damage.

The GS ESD P/N diode is formed in a p-type substrate 100. Transistor gate 110 and transistor gate dielectric 108 prevents the N+ diffusion 106 from forming a diode with the P+ diffusion 104. The transistor gate 110 is shorted to the P+ diffusion 104. Unlike the conventional GS ESD P/N diode in FIG. 2, the pwell is removed from under the N+ diffusion 106. Since the p-type substrate 100 is more lightly doped than the pwell 102, the depletion region formed when the N+ diffusion 106 is reversed biased is significantly larger than the depletion region formed between the N+ diffusion and pwell in a conventional P/N ESD protection diode (FIG. 2). The larger depletion layer width of the GS ESD P/N diode in turn leads to a substantial reduction in its bottom wall diode capacitance 135. The total capacitance of the GS ESD P/N diode is a sum of the bottom wall diode capacitance 135, sidewall diode capacitance 137 and gate 110 to N+ diffusion 106 overlap capacitance 133. The overlap capacitance 133 of the GS ESD P/N diode may be lowered by decreasing the gate 110 to N+ diffusion 106 overlap. Bringing the pwell 102 boundary under the gate 110 closer to the N+ diffusion 106 may retard N+ dopant diffusion under the gate and further reduce overlap capacitance 133. However, if the boundary of the pwell 102 gets too close to the N+ diffusion 106, sidewall capacitance 137 may be increased. The position of the boundary of the pwell 102 under the gate may thus be optimized for minimum GS ESD P/N diode capacitance.

The lower capacitance of the GS P/N ESD diode reduces degradation of circuit performance enabling the integrated circuit to operate at higher frequencies. In an example embodiment of a GS ESD P/N diode, the p-type substrate 100 doping concentration is about $1.4 \times 10^{15}/cm^3$, the pwell 102 doping concentration is about $8 \times 10^{17}/cm^3$, and the N+ diffusion 106 doping concentration is about $3 \times 10^{20}/cm^3$. A depletion region formed between the N+ diffusion 106 and the p-type substrate 100 is about 20 times larger than a depletion region formed between the N+ diffusion 106 and the pwell 102. With optimized Pwell 102 boundary position under the gate 110, the example embodiment of the GS ESD P/N diode shown in FIG. 7 achieves a 2× reduction in total diode capacitance compared to the prior art GS ESD P/N diode (FIG. 2).

Figure 9:
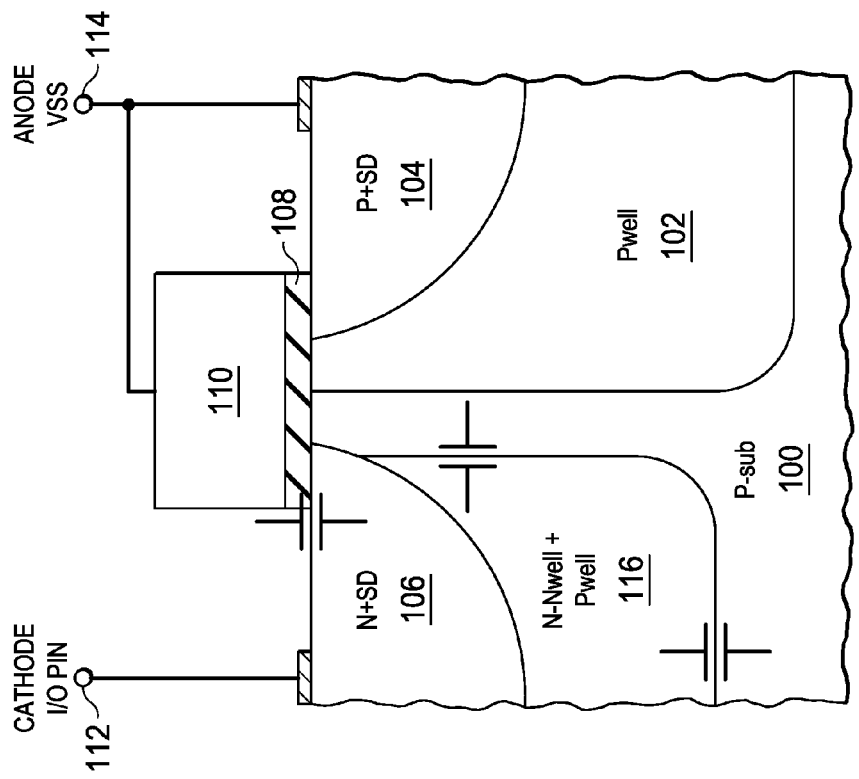
FIG. 9 is a cross-section of an embodiment of a gate spaced, ESD protection, N/P diode formed according to principles of the invention

Another embodiment of a gate spaced ESD protection P/N diode (GS ESD P/N diode) with additionally reduced capacitance is illustrated in FIG. 9. A counter doped nwell N− diffusion 116 is formed under the N+ diffusion 106 as described previously. The GS ESD P/N diode is formed in this embodiment example between the counter doped nwell N− diffusion 116 and the lightly doped p-type substrate 100. The depletion region formed is significantly larger than the depletion region formed between the heavily doped N+ diffusion 106 and the pwell 102 (FIG. 1). In an example embodiment of a GS ESD P/N diode, the p-type substrate 100 doping concentration is about $1.4 \times 10^{15}/cm^3$, the pwell 102 doping concentration is about $8 \times 10^{17}/cm^3$, and the counter doped nwell N− diffusion 116 doping concentration is about $3 \times 10^{17}/cm^3$. A depletion region formed between the counter doped nwell N− diffusion 116 and the p-type substrate 100 is about 20 times larger than a depletion region formed between the N+ diffusion 106 and the pwell 102 (FIG. 2). With optimized Pwell 102 boundary position under the gate, the example embodiment of a GS ESD P/N diode shown in FIG. 9 achieves a 2× reduction in total diode capacitance compared to the prior art GS ESD P/N diode (FIG. 2).

Figure 10:
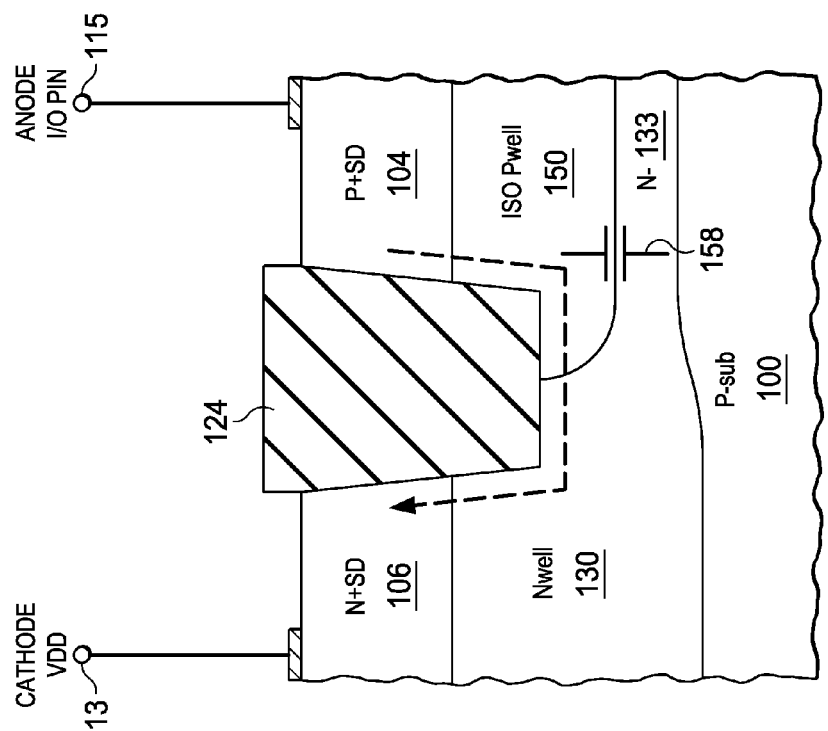
FIG. 10 is a cross-section of an embodiment of a shallow trench spaced, ESD protection, N/P diode formed according to principles of the invention

An embodiment of an STI spaced ESD protection N/P diode (STI ESD N/P diode) with reduced capacitance is illustrated in FIG. 10. The cathode 113 which is connected to the N+ diffusion 106 of the STI ESD N/P diode is connected to the power supply (Vdd). The anode 115 which is connected to the isolated pwell 150 contact diffusion 104 is connected to an input/output (I/O) pin. An ESD event on the I/O pin causes the STI ESD N/P diode to become forward biased shunting the ESD current to the power supply (Vdd).

The STI ESD N/P diode is formed in nwell 130 which is formed in a p-type substrate 100. Shallow trench isolation 124 prevents the N+ diffusion 106 from forming a diode with P+ diffusion 104. Unlike the conventional STI ESD N/P diode in FIG. 3, a lightly doped isolated pwell 150 is formed under the heavily doped P+ diffusion 104. The implant tail of the p-type dopant used to form the isolated pwell 150 also counter dopes the nwell under the isolated pwell turning it from n type to more lightly doped N− 133. Since the isolated pwell 150 is more lightly doped than the P+ diffusion 104, and the counter doped N− 133 is more lightly doped than the nwell 130, the depletion region formed when the N− 133 to isolated pwell 150 junction is reversed biased is significantly larger than the depletion region formed between the nwell 130 to P+ diffusion 104 junction in the conventional STI ESD N/P diode (FIG. 3). Since diode capacitance is inversely proportional to the width of the depletion region formed when the diode is reverse biased, the capacitance of the ESD diode is significantly reduced. The lower capacitance of the STI ESD N/P diode reduces degradation of circuit performance enabling the integrated circuit to operate at higher frequencies. In an example embodiment of a low capacitance STI ESD N/P diode, the isolated pwell 150 doping concentration is about $3 \times 10^{17}/cm^3$, the N− 131 doping concentration is about $3 \times 10^{17}/cm^3$, and the P+ diffusion 104 doping concentration is about $3 \times 10^{20}/cm^3$. A depletion region formed between the isolated pwell diffusion 150 and the counter doped N− 131 is about 20 times larger than a depletion region formed between the P+ diffusion 104 and the nwell 130. The STI ESD N/P diode in the example embodiment reduces the STI ESD N/P diode capacitance 158 by about 20 times.

Another embodiment of an ultra low capacitance STI spaced ESD protection N/P diode (STI ESD N/P diode) with additionally reduced capacitance is illustrated in FIG. 12. A counter doped nwell N− diffusion 116 is formed under the N+ diffusion 106 and a counter doped nwell N− diffusion is formed under the isolated pwell 150. The depletion region of this STI ESD N/P diode is formed between the lightly doped isolated pwell 150 which is under the P+ diffusion 104 and the lightly doped counter doped nwell N− diffusion 116 and lightly doped N− diffusion 133. The depletion region formed between the lightly doped isolated pwell 150 and the lightly doped counter doped nwell N− diffusion 116 and counter doped N− diffusion 133 is significantly larger than between lightly doped isolated pwell 150 and moderately doped nwell 130 (FIG. 11) or between heavily doped P+ 104 (FIG. 4) and moderately doped nwell 130. In an example embodiment of an ultra low capacitance STI ESD N/P diode, the isolated pwell 150 doping concentration is about $3 \times 10^{17}/cm^3$, the counter doped nwell N− diffusion 116 doping concentration is about $3 \times 10^{17}/cm^3$ and the counter doped N− diffusion 133 is about $3 \times 10^{17}/cm^3$. A depletion region formed between the isolated pwell diffusion 150 and the counter doped nwell N− diffusion 116 and N− 133 is about 20 times larger than a depletion region formed between the P+ diffusion 104 and the nwell 130 (FIG. 4). The ultra low capacitance STI ESD N/P diode in this example embodiment reduces the STI ESD N/P diode capacitance 159 by about 20 times.

Figure 11:
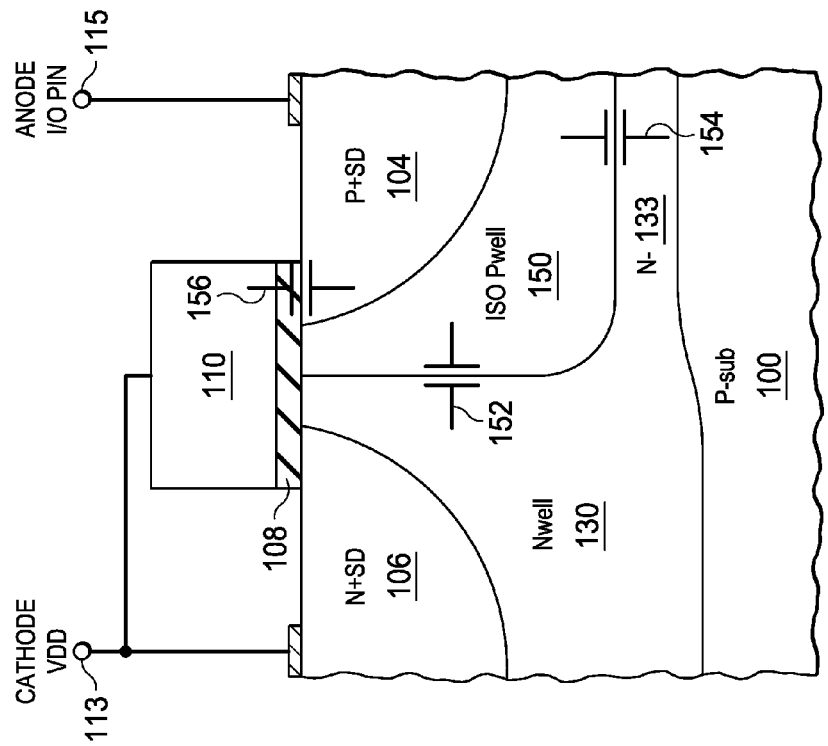
FIG. 11 is a cross-section of an embodiment of a gate spaced, ESD protection, N/P diode formed according to principles of the invention

An embodiment of a gate spaced, ESD protection, N/P diode (GS ESD N/P diode) with reduced capacitance is illustrated in FIG. 11. The cathode 113 which is shorted to the diode gate 110 is connected to the N+ diffusion 106 of the GS ESD N/P diode and is connected to the power supply (Vdd). The anode 115 which is connected to the isolated pwell 150 P+ contact diffusion 104 is also connected to an I/O pin. An ESD event on the I/O pin causes the GS ESD N/P diode to become forward biased shunting the ESD current to the power supply (Vdd), thus protecting the IC from damage. The lower capacitance of the low capacitance GS ESD N/P diode improves circuit performance and enables the IC to operate at higher frequency.

The GS ESD N/P diode is formed in a p-type substrate 100. Transistor gate 110 and transistor gate dielectric 108 prevents the N+ diffusion 106 from forming a diode with the P+ diffusion 104. The transistor gate 110 is shorted to the N+ diffusion 106. Unlike the conventional GS ESD N/P diode (FIG. 4) a lightly doped isolated pwell 1501 is formed under the heavily doped P+ diffusion 104. Since the isolated pwell 150 is more lightly doped than the P+ diffusion 104, the depletion region formed when the nwell 130 to isolated pwell 150 junction is reversed biased is significantly larger than the depletion region formed between the nwell 130 and P+ 104 junction in the conventional GS ESD N/P diode. The larger depletion layer width of the GS ESD N/P diode in turn leads to a substantial reduction in bottom wall diode capacitance 154. The total capacitance of the GS ESD N/P diode is a sum of the bottom wall diode capacitance 154, the sidewall diode capacitance 152, and the gate 110 to P+ diffusion 1-4 overlap capacitance 156. The overlap capacitance 156 of the GS ESD N/P diode may be lowered by decreasing the gate 110 to P+ diffusion 104 overlap. Bringing the isolated pwell 150 boundary under the gate 110 closer to the P+ diffusion 104 further reduces overlap capacitance 156. However, if the boundary of the isolated pwell 150 falls inside the P+ diffusion 104, the sidewall capacitance 152 may be increased. The position of the boundary of the isolated pwell 150 under the gate 110 may thus be optimized for minimum GS ESD N/P diode capacitance.

The lower capacitance of the GS ESD N/P diode reduces degradation of circuit performance enabling the integrated circuit to operate at higher frequencies. In an example embodiment of a GS ESD N/P diode, the doping concentration of the isolated pwell and counter doped Nwell 133 are about $3 \times 10^{17}/cm^3$, the nwell 130 doping concentration is about $1 \times 10^{18}/cm^3$, and the P+ diffusion 104 doping concentration is about $3 \times 10^{20}/cm^3$. A depletion region formed between the counter doped nwell 133 and the isolated pwell 150 is about 20 times larger than a depletion region formed between the P+ diffusion 104 and the nwell 130. With optimized isolated pwell 150 boundary position under the gate 110, the example embodiment of a GS ESD N/P diode shown in FIG. 11 achieves a 2× reduction in total diode capacitance compared to the prior art GS ESD N/P diode (FIG. 4).

Another embodiment of a gate spaced, ESD protection, N/P diode (GS ESD N/P diode) with reduced capacitance is illustrated in FIG. 13. This embodiment contains two counter doped nwell N− diffusions 116 and 133. Region 116 is formed under the N+ diffusion 106 and region 133 is formed under the lightly doped isolated pwell 150. The capacitance of this GS ESD N/P diode is significantly reduced because of the wide depletion region formed between the lightly doped isolated pwell 150 and the two counter doped nwell N− diffusions 116 and 133. In an example embodiment of an ultra low capacitance GS ESD N/P diode, the isolated pwell 150 doping concentration is about $3 \times 10^{17}/cm^3$ and the counter doped nwell N− diffusion 116 doping concentration is about $3 \times 10^{17}/cm^3$. A depletion region formed between the isolated pwell diffusion 150 and the counter doped nwell N− diffusion 116 is about 25 times larger than a depletion region formed between the P+ diffusion 104 and the nwell 130 (FIG. 4). With optimized isolated pwell boundary position under the gate 110, the ultra low capacitance STI ESD N/P diode in this example embodiment achieves about a 2.5× reduction in total diode capacitance compared to the prior art GS ESD N/P diode (FIG. 4).

Figure 14:
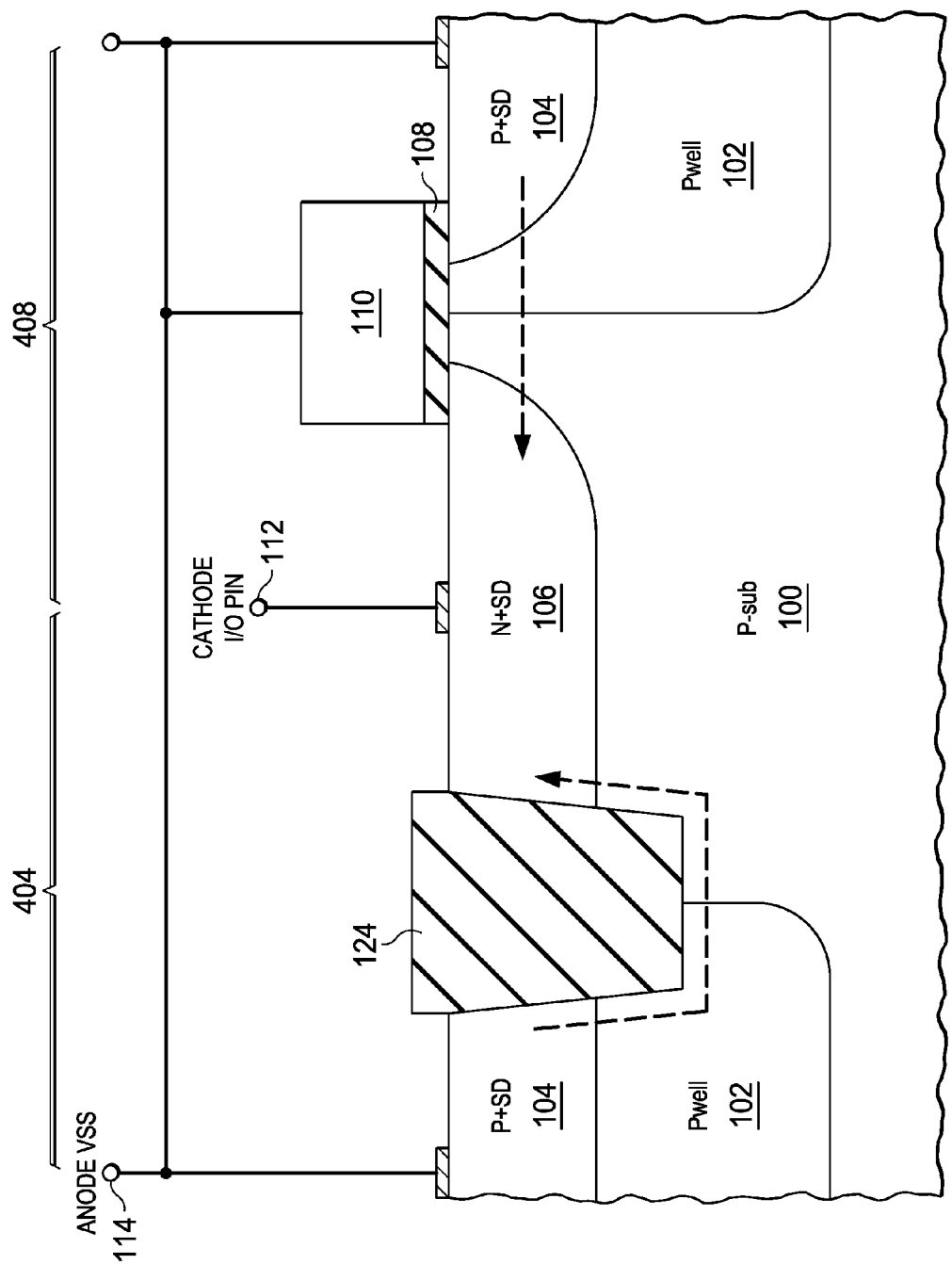
FIG. 14 is a cross-section of an embodiment of a gate spaced, ESD protection P/N diode connected in parallel with an embodiment of an STI spaced, ESD protection P/N diode to form and ESD protection diode according to principles of the invention.

In another embodiment illustrated in FIG. 14, a STI ESD P/N diode 404 is connected in parallel with a GS ESD P/N diode 408 to form a STI+GS ESD P/N diode. The GS ESD P/N diode 408 turns on fast during an ESD strike avoiding voltage overshoot. The GS ESD P/N diode 408 may be made small to reduce capacitance and the STI ESD P/N diode 404 may be made as large as is needed to handle the majority of the ESD current. This embodiment provides sufficient ESD current handling capability and fast turn on with reduced capacitance. A counter doped nwell N− diffusion may be formed under the N+ diffusion to additionally reduce capacitance.

Figure 15:
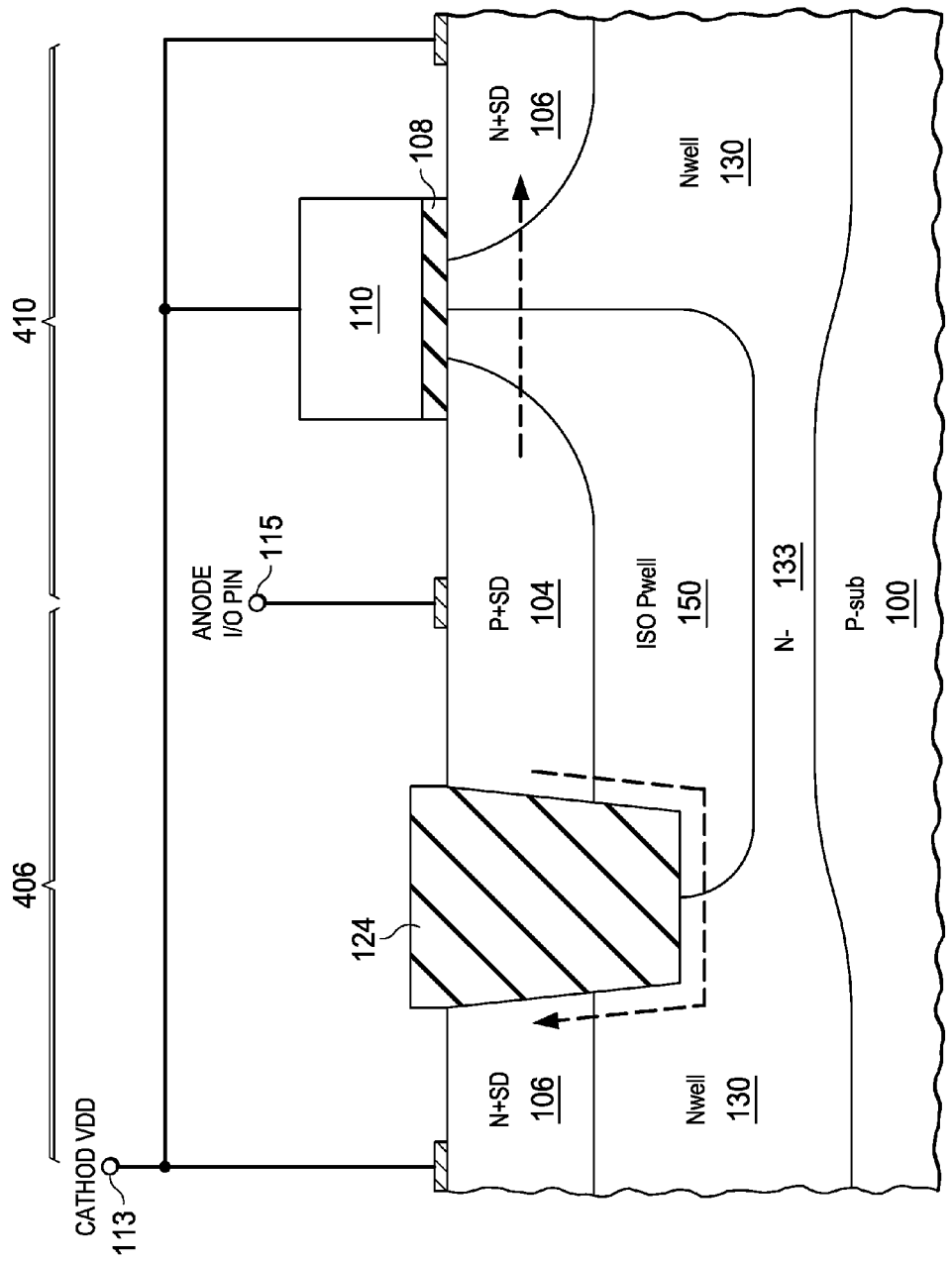
FIG. 15 is a cross-section of an embodiment of a gate spaced, ESD protection N/P diode connected in parallel with an embodiment of an STI spaced, ESD protection N/P diode to form an ESD protection diode according to principles of the invention.

In another embodiment illustrated in FIG. 15, a STI ESD N/P diode 406 is connected in parallel with a GS ESD N/P diode 410 to form a STI+GS ESD N/P diode. The GS ESD N/P diode 410 turns on fast during an ESD strike avoiding voltage overshoot. The GS ESD N/P diode 410 may be made small to reduce capacitance and the STI ESD N/P diode 406 may be made as large as needed to handle the majority of the ESD current. This embodiment provides adequate ESD current handling capability plus fast turn on and reduced capacitance. A counter doped nwell N− diffusion may be formed under the N+ diffusions 106 to additionally reduce capacitance.

Although p-type substrates are used to illustrate the embodiments, n-type substrates may also be used.

Example embodiment processes for forming transistors plus low capacitance ESD protection diodes in an integrated circuit are illustrated in cross sections FIG. 16A-16H and in cross sections FIG. 17A-17H. In FIGS. 16A-16H, an NMOS transistor is formed in region 400, a PMOS transistor is formed in region 402, an STI ESD P/N diode is formed in region 404, and an STI ESD N/P diode is formed in region 406. In FIGS. 17A-17H, an NMOS transistor is formed in region 400, a PMOS transistor is formed in region 402, a GS ESD P/N diode is formed in region 408, and a GS ESD N/P diode is formed in region 410.

Figure 16A:
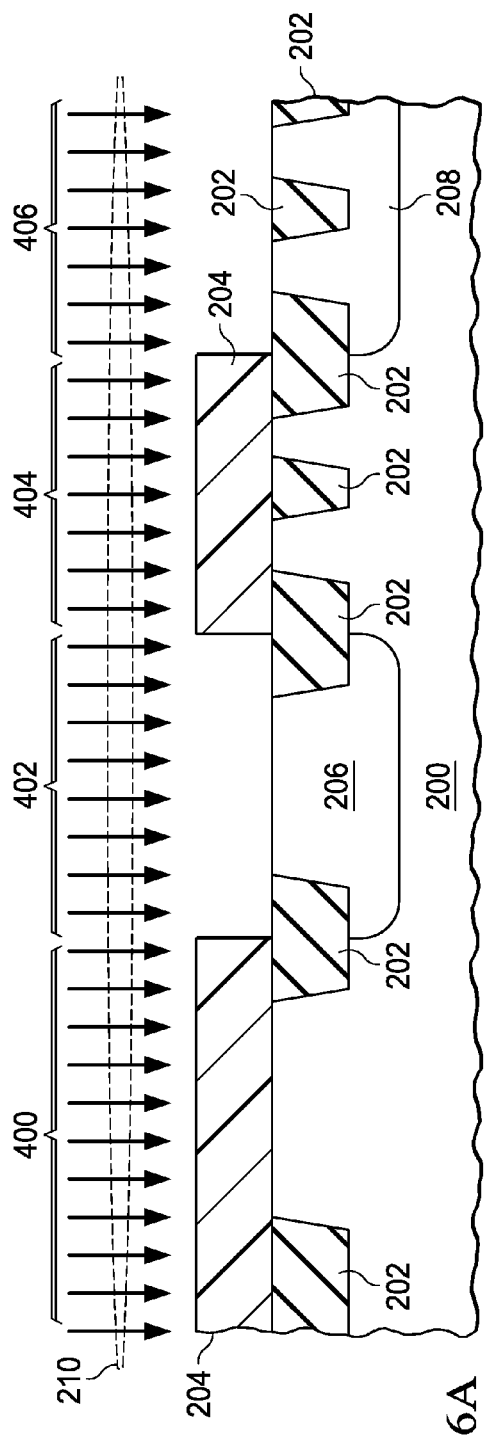
Figure 17A:
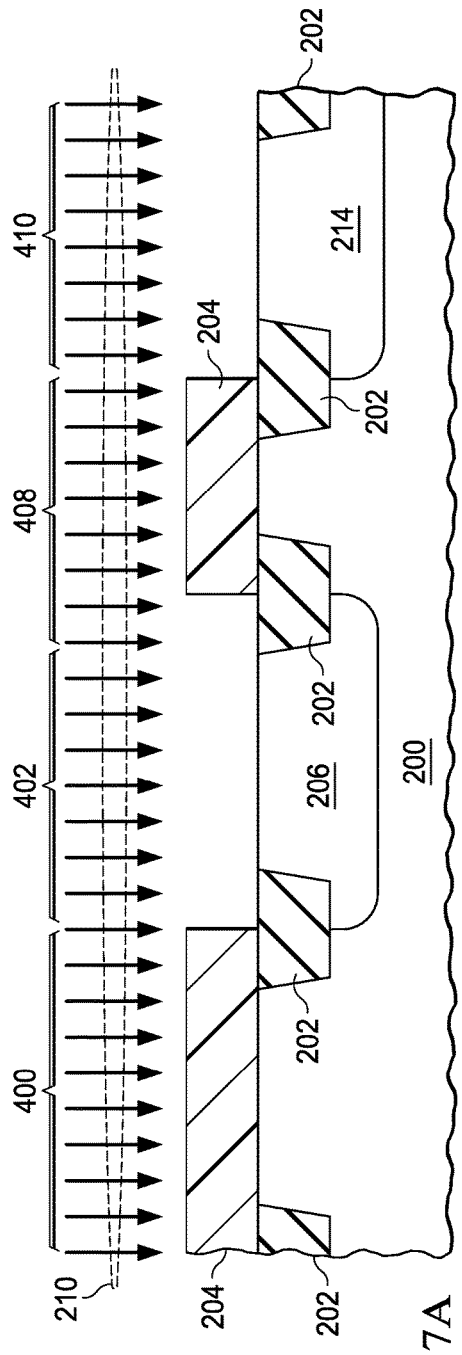

FIG. 16A and FIG. 17A show a partially processed integrated circuit wafer. Shallow trench isolation (STI) dielectric geometries 202 are formed to electrically isolate the integrated circuit devices from each other. Nwell photo resist pattern 204 is formed on the integrated circuit with an opening to form an nwell 206 for a PMOS transistor 402, an nwell 208 (FIG. 16A) for a STI ESD N/P diode 406, and an nwell 214 (FIG. 17A) for a GS ESD N/P diode 410. An n-type dopant 210 is implanted to form the nwells.

Figure 16B:
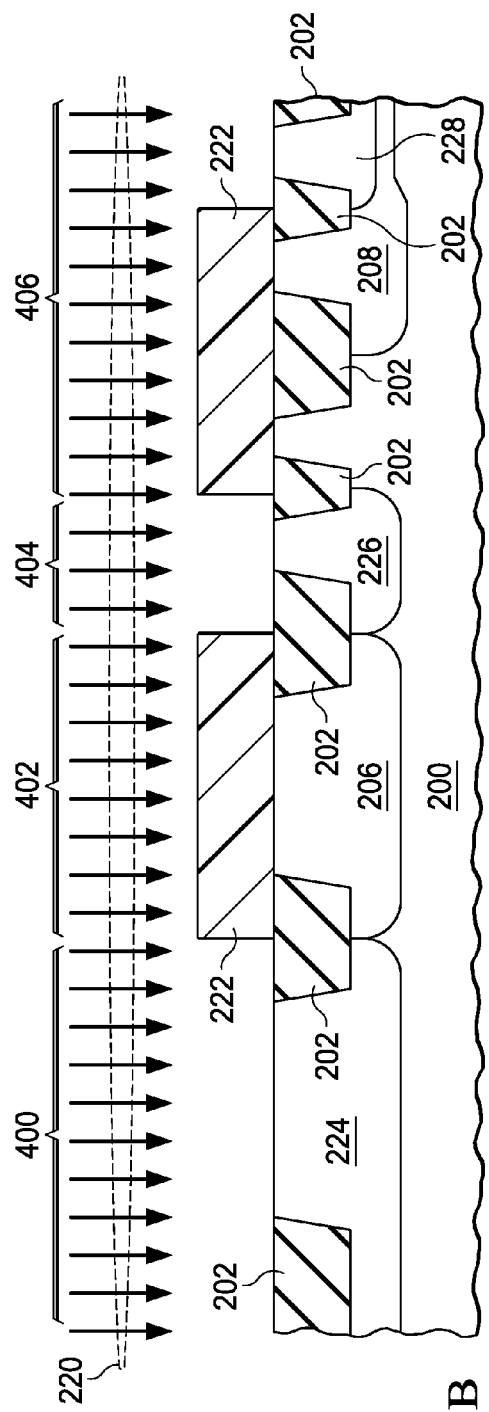
Figure 17B:
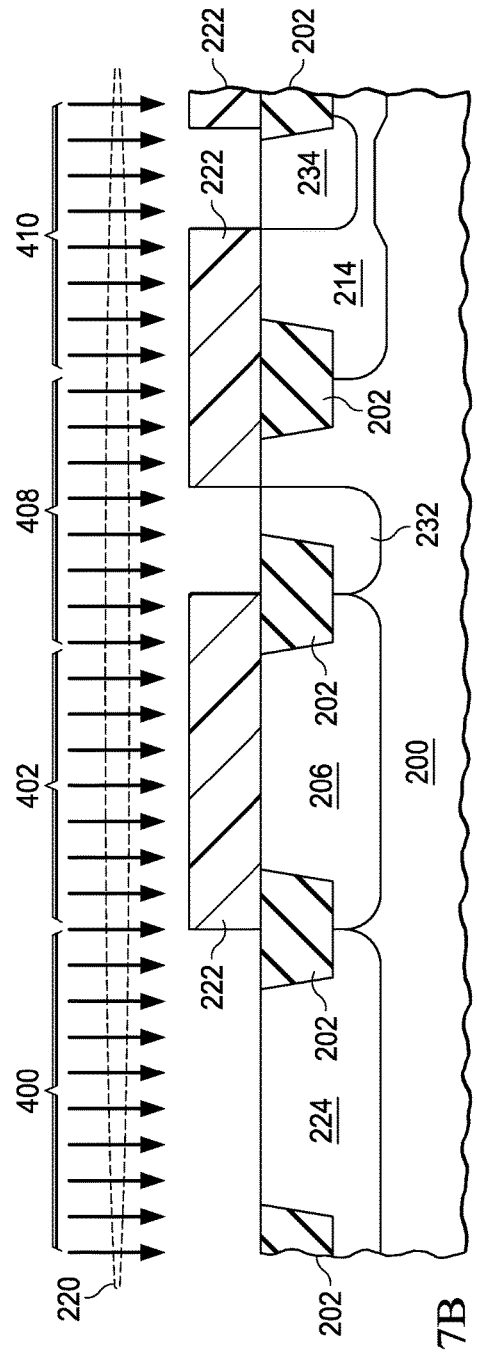

In FIG. 16B and FIG. 17B, a pwell photo resist pattern 222 is formed with openings to form pwell 224 for an NMOS transistor 400, pwell 226 (FIG. 16A) for an STI ESD P/N diode 404, isolated pwell 228 for an STI ESD N/P diode, pwell 232 (FIG. 17B) for a GS ESD P/N diode 408 and isolated pwell 234 for a GS ESD N/P diode 410. P-type dopant 220 is implanted to form the pwells and isolated pwells.

The isolated pwells may also be formed using a separate isolated pwell photo resist pattern and implant, but in this example embodiment process flow, the pwell dopant 220 forms both the pwells and the isolated pwells. Using pwell dopant 220 to form both the pwells and the isolated pwells eliminates the additional patterning and implantation steps saving significant cost.

Figure 16C:
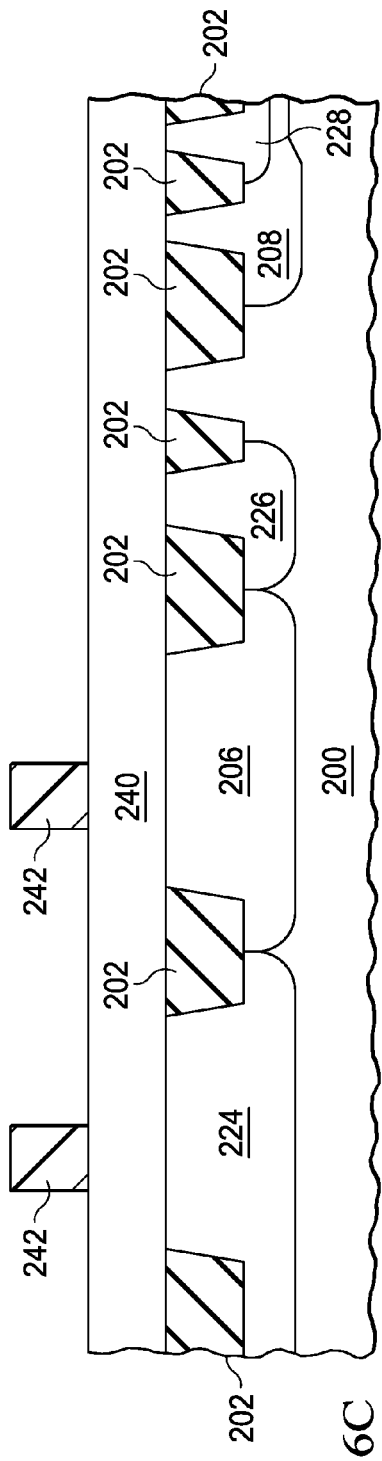
Figure 17C:
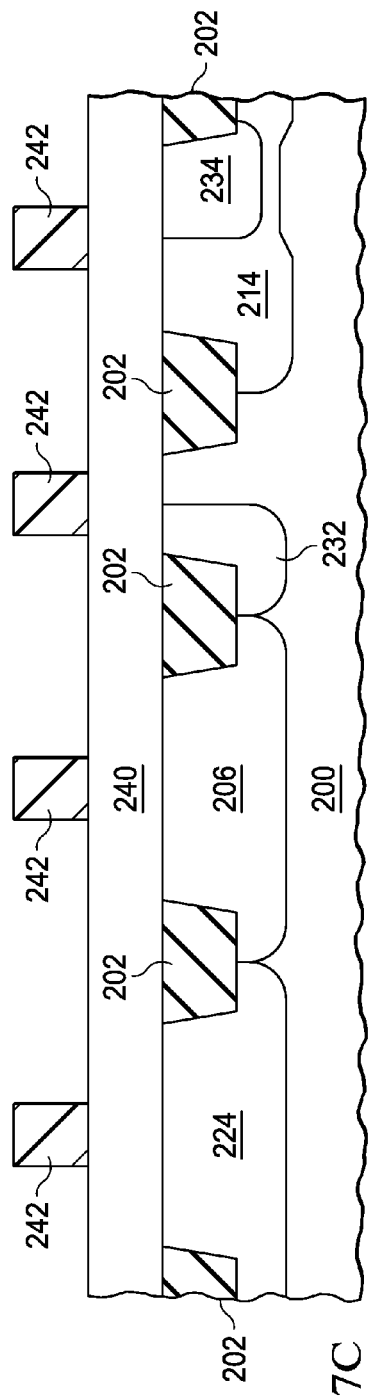

Referring now to FIGS. 16C and 17C, a gate dielectric is grown or deposited on the integrated circuit and a gate material 240 such as polysilicon is deposited on the gate dielectric. A gate photo resist pattern 242 is formed on the gate material 240. Although polysilicon transistors are used to illustrate the embodiments, other gate materials such as metal gates may also be used.

Figure 16D:
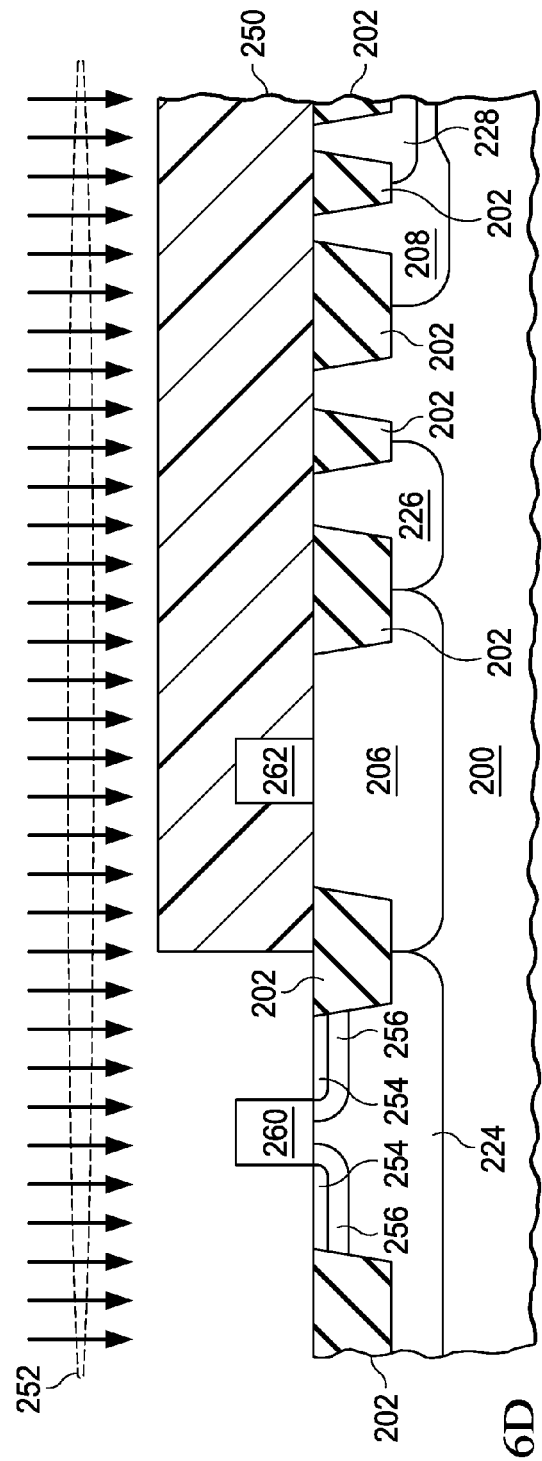
Figure 17D:
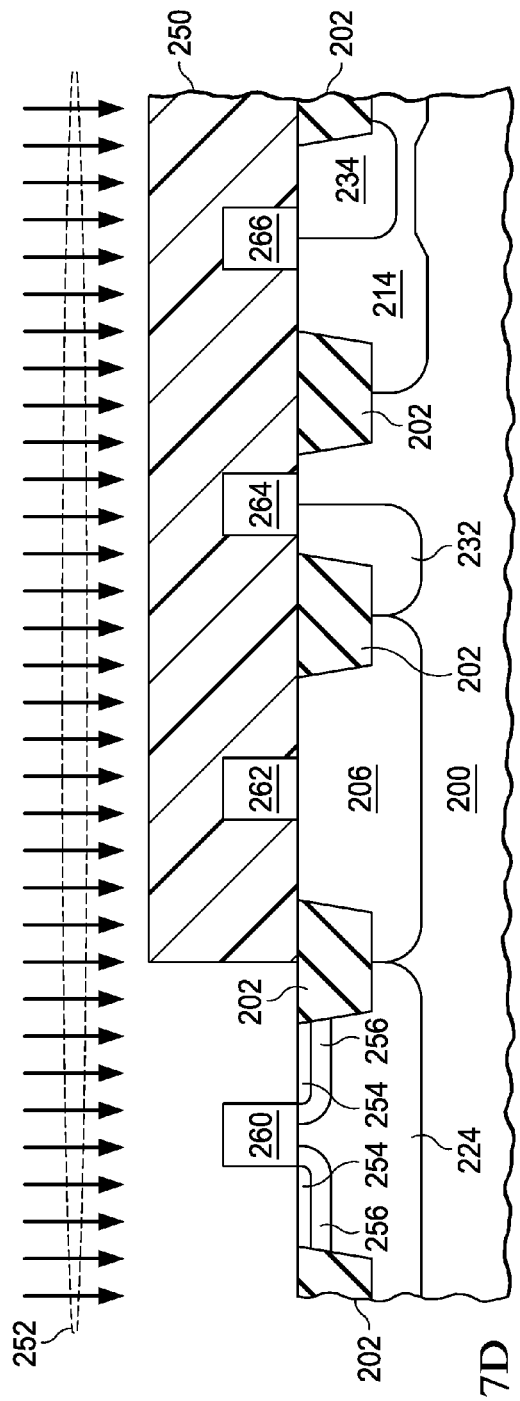

In FIGS. 16D and 17D an NMOS transistor source and drain extension photo resist pattern 250 is formed on the integrated circuit and an n-type dopant 252 such as phosphorus or arsenic is implanted self aligned to the NMOS transistor gate 260 to form source and drain extensions 254. A p-type dopant may also be implanted at an angle using the same photo resist pattern 250 to form halo diffusions 256 under the edges of the NMOS transistor gate 256 to set the transistor threshold voltage (Vtn)

PMOS transistor source and drain extension photo resist pattern 270 is formed on the integrated circuit in FIGS. 16E and 17E. A p-type dopant 272 such as boron or BF2 is implanted to form the source and drain extensions 274 self aligned to the PMOS transistor gate 262. An n-type implant such as phosphorus or arsenic may also be implanted at an angle using the same photo resist pattern 270 to form halo diffusions 276 under the edges of the PMOS transistor gate to set the PMOS threshold voltage (Vtp).

In FIGS. 16F and 17F after sidewalls 284 are formed on the sides of the transistor gates, 260, 262 and diode gates 264, 266, a PMOS source and drain photo resist pattern (PSD) 280 is formed on the integrated circuit. A p-type dopant 282 such as boron or BF2 is implanted to form the deep source and drain diffusions 286 on the PMOS transistor 262. The p-type dopant also forms a low resistance contact diffusion 290 to the isolated pwell 228 (FIG. 16F) of and a low resistance contact diffusion 288 to the pwell 226 (FIG. 16F). In addition, the p-type dopant forms a low resistance contact diffusion 292 to pwell 232 (FIG. 17F) and a low resistance contact diffusion 294 to the isolated pwell 234 (FIG. 17F).

Figure 16G:
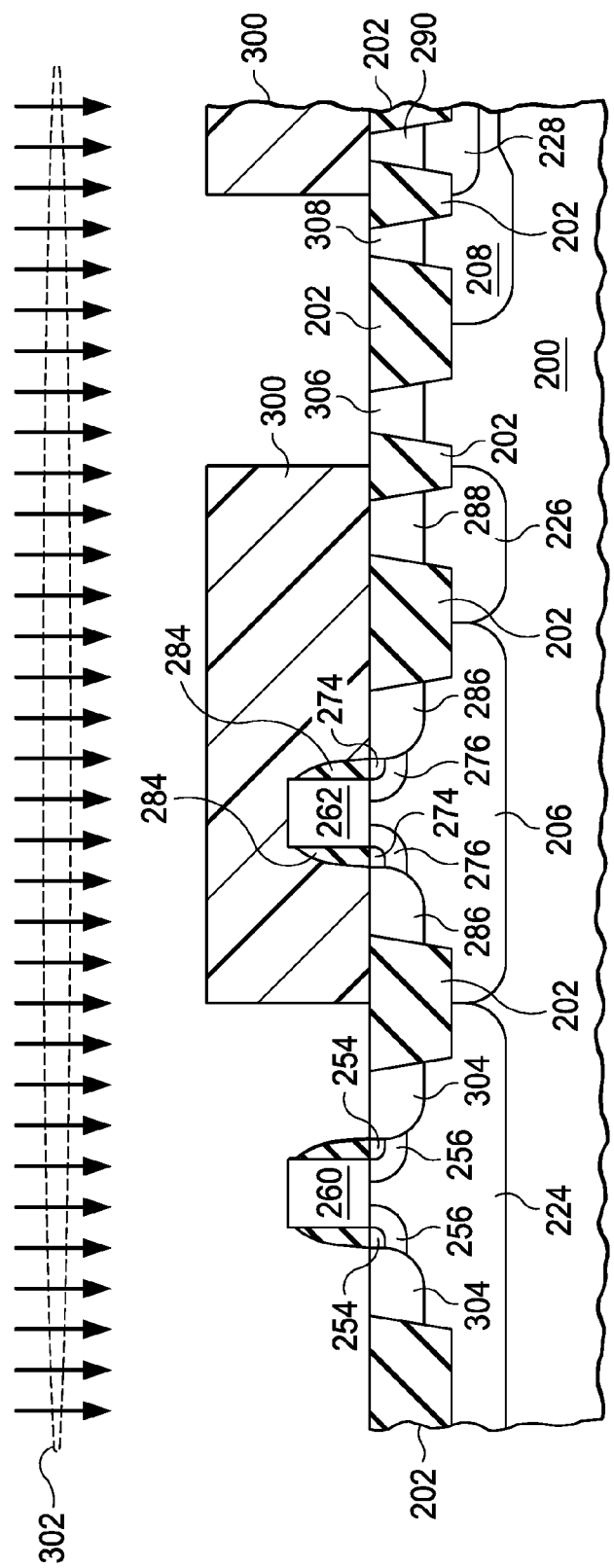
Figure 17G:
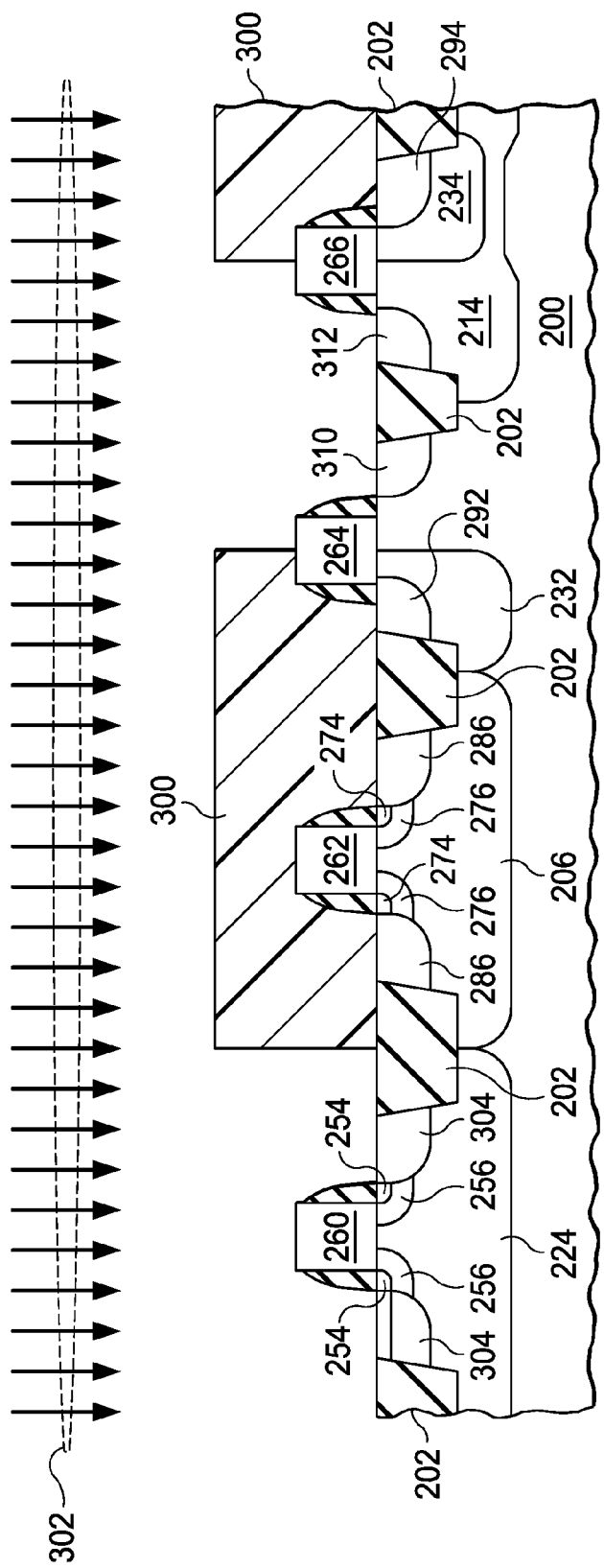

Referring now to FIGS. 16G and 17G, a NMOS transistor source and drain (NSD) photo resist pattern 300 is formed on the integrated circuit and n-type dopants 302 such phosphorus and arsenic are implanted to form the deep source and drain diffusions 304 self aligned to the sidewalls 284 on the gate 260 of the NMOS transistor. The n-type dopant 302 also forms the N+ diffusion 306 (FIG. 16G) of the STI ESD P/N diode and a low resistance contact 308 (FIG. 16G) to the nwell 208. In addition, the n-type implant 302 forms the N+ diffusion 310 (FIG. 17G) of the GS ESD P/N diode and the low resistance contact 312 (FIG. 17G) to nwell 210 (FIG. 17G).

Figure 16H:
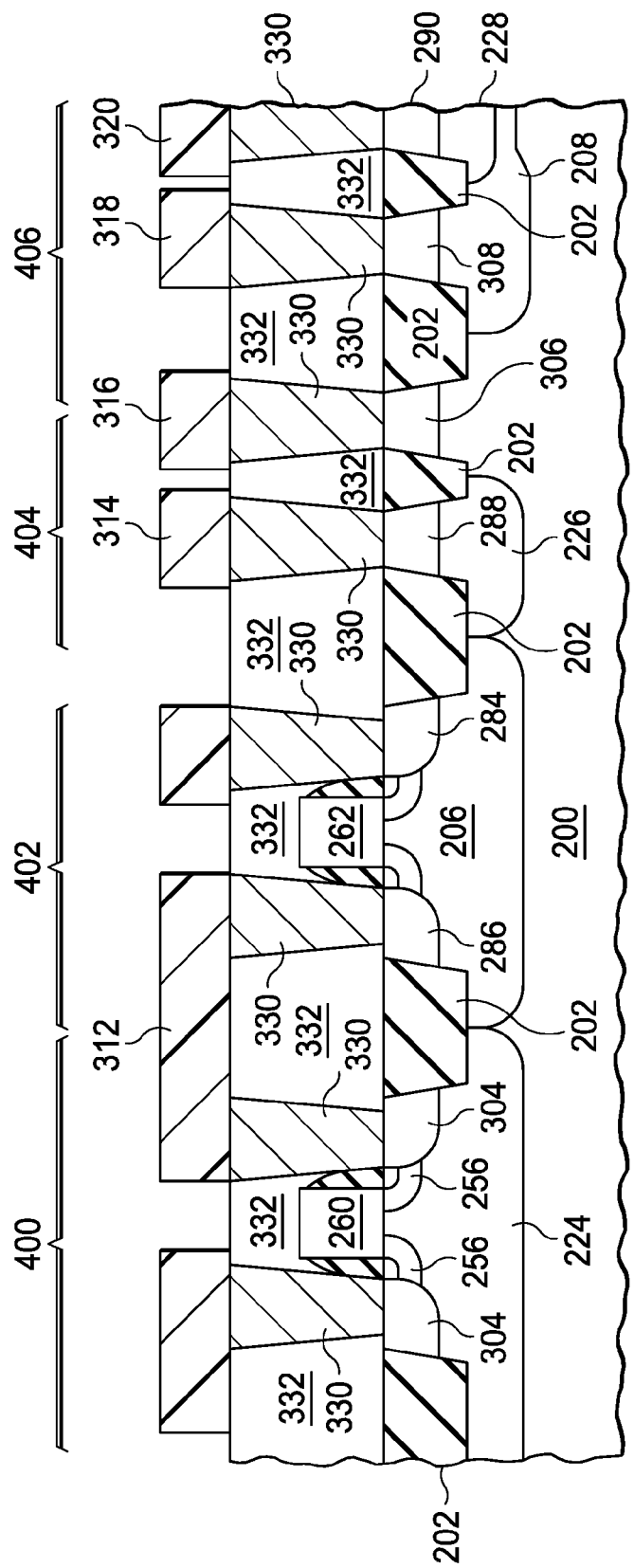
Figure 17H:
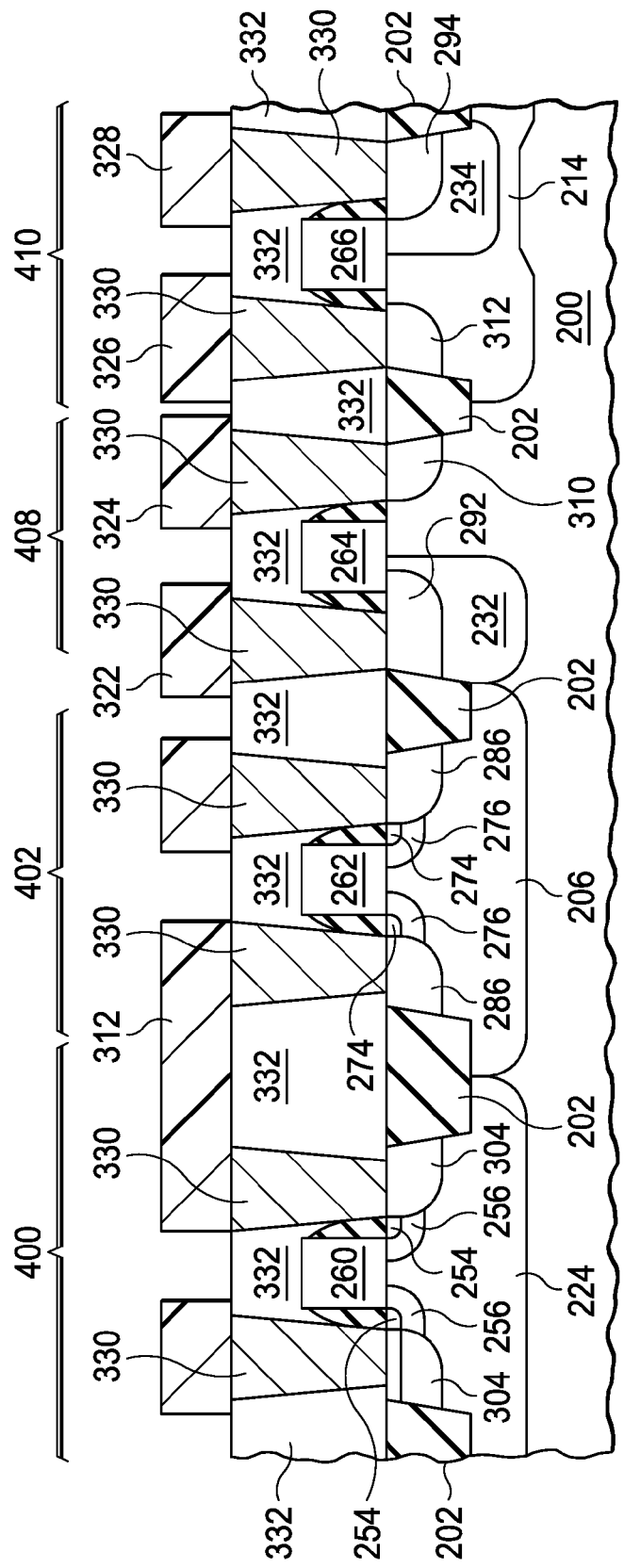

In FIGS. 16H and 17H premetal dielectric layer 310 is deposited and contact plugs 330 are formed to connect N+ and P+ diffusions to the first interconnect layer 312. Other layers of intermetal dielectric, vias, and interconnect may be formed above the first level of interconnect to complete the integrated circuit.

The N+ diffusion 308 (cathode) of the STI ESD P/N diode 404 is connected through interconnect 316 to an I/O pin, and the P+ diffusion 288 (anode) is connected through interconnect 314 to Vss or ground. The cathode 320 of the STI ESD N/P diode 406 is connected to Vdd and the anode 318 is connected to and I/O pin.

In FIG. 17H the N+ diffusion 310 (cathode) of the GS ESD P/N diode 408 is connected through interconnect 324 to an I/O pin. The P+ diffusion 292 (anode) is connected through interconnect 322 to Vss or ground. The diode gate 264 is also connected to Vss or ground.

The cathode 326 of the GS ESD N/P diode 410 in FIG. 17H is connected to the power supply (Vdd) and the anode 328 is connected to an I/O pin. The diode gate 266 is also connected to Vdd.

The integrated circuit used to illustrate the formation of the embodiments uses typical CMOS processing on a p-type substrate. The process for forming the embodiments may also include using CMOS processing on an n-type substrate.

Those skilled in the art to which this invention relates will appreciate that many other embodiments and variations are possible within the scope of the claimed invention.

What is claimed is:

1. An integrated circuit, comprising:
a p-type substrate;
an nwell formed in said p-type substrate; and
a STI+GS ESD diode further comprising:
   an ESD diode STI geometry formed in said p-type substrate where said ESD diode STI geometry electrically isolates a first diffusion with a first doping type from a second diffusion with a second doping type;
   a ESD diode gate geometry formed on said p-type substrate where said ESD diode gate geometry extends over a third diffusion with a first doping type and said second diffusion;
   where said second diffusion is coupled to an input/output pin of said integrated circuit; and
   a direct conductive connection that couples said first diffusion, said third diffusion, and said ESD diode gate geometry to each other and to a fixed voltage.

2. The integrated circuit of claim 1 where said STI+GS ESD diode is a STI+GS ESD P/N diode where said first and said third diffusions are N+ diffusions which form contacts to said nwell, where said second diffusion is a P+ diffusion in said nwell and where said STI+GS ESD P/N diode is formed between said P+ diffusion and said nwell and where said fixed voltage is Vdd.

3. The integrated circuit of claim 1 further comprising an isolated pwell formed in said nwell where said STI+GS ESD diode is a STI+GS ESD P/N diode where said first and said third diffusions are N+ diffusions which form contacts to said nwell, where said second diffusion is a P+ diffusion in said isolated pwell and where said STI+GS ESD P/N diode is formed between said isolated pwell and said nwell and where said fixed voltage is Vdd.

4. The integrated circuit of claim 1 further comprising:
an isolated pwell formed in said nwell;
counter doped N− regions of said nwell;
where said STI+GS ESD diode is a STI+GS ESD P/N diode;
where said first and said third diffusions are N+ diffusions which form contacts to said counter doped N− regions;
where said second diffusion is a P+ diffusion in said isolated pwell;
where said STI+GS ESD P/N diode is formed between said isolated pwell and said counter doped N− regions; and
where said fixed voltage is Vdd.

5. The integrated circuit of claim 4 where a pwell dopant implant forms said isolated pwell by counter doping a first region in said nwell, and forms said counter doped N− regions by counter doping a second region in said nwell.

6. The integrated circuit of claim 1 where said STI+GS ESD diode is a STI+GS ESD N/P diode where said first and said third diffusions are P+ diffusions which form contacts to said pwell, where said second diffusion is a N+ diffusion in said p-type substrate and where said STI+GS ESD P/N diode is formed between said N+ diffusion and said p-type substrate and where said fixed voltage is Vss or ground.

7. The integrated circuit of claim 1 further comprising a N− diffusion formed in said p-type substrate where said STI+GS ESD diode is a STI+GS ESD N/P diode where said first and said third diffusions are P+ diffusions which form contacts to said pwell, where said second diffusion is a N+ diffusion in said counter doped nwell N− diffusion and where said STI+GS ESD N/P diode is formed between said counter doped nwell N− diffusion and said p-type substrate and where said fixed voltage is Vss or ground.

8. The integrated circuit of claim 7 where a pwell dopant implant forms said pwell in said p-type substrate and forms said counter doped nwell N– diffusion by counter doping a region in said nwell.

9. An integrated circuit, comprising:
a p-type substrate;
an nwell formed in said p-type substrate; and
a diode further comprising:
  a STI geometry formed in said p-type substrate where said STI geometry electrically isolates a first diffusion with a first doping type from a second diffusion with a second doping type;
  a gate geometry formed on said p-type substrate where said gate geometry extends over a portion of a third diffusion with a first doping type and a portion of said second diffusion;
  wherein said second diffusion is coupled to an input/output pin of said integrated circuit; and
  a direct conductive connection that connects said first diffusion, said third diffusion, and said gate geometry to each other.

10. The integrated circuit of claim 9, wherein said diode is a P/N diode, said first and said third diffusions are N+ diffusions which form contacts to said nwell, said second diffusion is a P+ diffusion in said nwell, and said P/N diode is formed between said P+ diffusion and said nwell.

11. The integrated circuit of claim 9, further comprising an isolated pwell formed in said nwell where said diode is a P/N diode where said first and said third diffusions are N+ diffusions which form contacts to said nwell, where said second diffusion is a P+ diffusion in said isolated pwell and where said P/N diode is formed between said isolated pwell and said nwell.

12. The integrated circuit of claim 9, further comprising:
an isolated pwell formed in said nwell;
a counter doped N– region of said nwell;
wherein said diode is a P/N diode;
wherein said first and said third diffusions are N+ diffusions which form contacts to said counter doped N– region;
wherein said second diffusion is a P+ diffusion in said isolated pwell; and
wherein said P/N diode is formed between said isolated pwell and said counter doped N– region.

13. The integrated circuit of claim 12, wherein a pwell dopant implant forms said isolated pwell by counter doping a first region in said nwell, and forms said counter doped N-region by counter doping a second region in said nwell.

14. An integrated circuit, comprising:
a p-type substrate;
an nwell in said p-type substrate;
an isolated pwell in said nwell; and
a P/N diode further comprising:
  a STI geometry formed in said p-type substrate where said STI geometry electrically isolates a first N+ diffusion from a P+ diffusion;
  a gate geometry formed on said p-type substrate where said gate geometry extends over a portion of a second N+ diffusion and a portion of said P+ diffusion;
  wherein said P+ diffusion is coupled to an input/output pin of said integrated circuit;
  wherein a direct conductive connection connects said first N+ diffusion, said second N+ diffusion, and said gate geometry to each other;
  wherein said first and said second N+ diffusions form contacts to said nwell;
  wherein said P+ diffusion is located in said isolated pwell; and
  wherein said P/N diode is formed between said isolated pwell and said nwell.

15. The integrated circuit of claim 14, further comprising:
a counter doped N– region of said nwell;
wherein said first and said second N+ diffusions form contacts to said counter doped N– region; and
wherein said P/N diode is formed between said isolated pwell and said counter doped N– region.

* * * * *